(12) United States Patent
Epple et al.

(10) Patent No.: US 10,969,694 B2
(45) Date of Patent: Apr. 6, 2021

(54) PROJECTION LENS, PROJECTION EXPOSURE APPARATUS AND PROJECTION EXPOSURE METHOD

(71) Applicant: Carl Zeiss SMT GmbH, Oberkochen (DE)

(72) Inventors: Alexander Epple, Aalen (DE); David Shafer, Fairfield, CT (US)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/587,943

(22) Filed: Sep. 30, 2019

(65) Prior Publication Data

US 2020/0026199 A1 Jan. 23, 2020

Related U.S. Application Data

(63) Continuation of application No. PCT/EP2018/000145, filed on Mar. 29, 2018.
(Continued)

(30) Foreign Application Priority Data

May 5, 2017 (DE) ...................... 10 2017 207 582.1

(51) Int. Cl.
*G03F 7/20* (2006.01)

(52) U.S. Cl.
CPC ...... *G03F 7/70241* (2013.01); *G03F 7/70016* (2013.01); *G03F 7/70958* (2013.01)

(58) Field of Classification Search
CPC .. G03F 7/70241; G03F 7/70016; G03F 7/706; G03F 7/70958; G03F 7/2041; G03F 7/7025; G03F 7/70258; G03F 7/70325; G03F 7/70358; G03F 7/70308; G03F 7/7055; G03F 7/70575; G03F 7/7095–70966; G02B 13/143;
(Continued)

(56) References Cited

U.S. PATENT DOCUMENTS

| 6,806,942 B2 | 10/2004 | Schuster et al. |
| 2008/0117400 A1 | 5/2008 | Rostalski et al. |

(Continued)

FOREIGN PATENT DOCUMENTS

| DE | 102 21 386 A1 | 11/2003 |
| DE | 10 2008 015 775 A1 | 12/2008 |

(Continued)

OTHER PUBLICATIONS

Translation of International Search Report for corresponding Appl No. PCT/EP2018/000145, dated Oct. 2, 2018.

*Primary Examiner* — Christina A Riddle
(74) *Attorney, Agent, or Firm* — Fish & Richardson P.C.

(57) ABSTRACT

A refractive projection lens for imaging a pattern in an object plane of the projection lens into an image plane of the projection lens via electromagnetic radiation of a mercury vapor lamp includes a multiplicity of lens elements are arranged along an optical axis between the object and image planes. The lens elements image a pattern in the object plane into the image plane with a reducing imaging scale. The lens elements include first lens elements made of a first material with a relatively low Abbe number and a second lens elements made of a second material with a higher Abbe number relative to the first material.

30 Claims, 11 Drawing Sheets

Related U.S. Application Data

(60) Provisional application No. 62/480,625, filed on Apr. 3, 2017.

(58) Field of Classification Search
CPC ...... G02B 13/22; G02B 13/14; G02B 13/146; G02B 27/0025; G02B 27/0031; G02B 27/0043; G02B 27/005; G02B 27/0062; G02B 9/34–64
USPC .......... 355/52–55, 67–71, 77; 359/673–797, 359/809
See application file for complete search history.

(56) References Cited

U.S. PATENT DOCUMENTS

| | | | | |
|---|---|---|---|---|
| 2008/0291545 A1* | 11/2008 | Ishii | ..................... | G02B 15/173 |
| | | | | 359/684 |
| 2008/0297884 A1* | 12/2008 | Mueller | ............... | G02B 13/143 |
| | | | | 359/351 |
| 2009/0059358 A1* | 3/2009 | Epple | ................. | G02B 17/0892 |
| | | | | 359/366 |
| 2009/0303596 A1* | 12/2009 | Ryu | ..................... | G02B 15/173 |
| | | | | 359/557 |

FOREIGN PATENT DOCUMENTS

| | | |
|---|---|---|
| EP | 0 416 651 A2 | 3/1991 |
| EP | 1 855 160 A2 | 11/2007 |
| JP | 2000-199850 A | 7/2000 |

\* cited by examiner

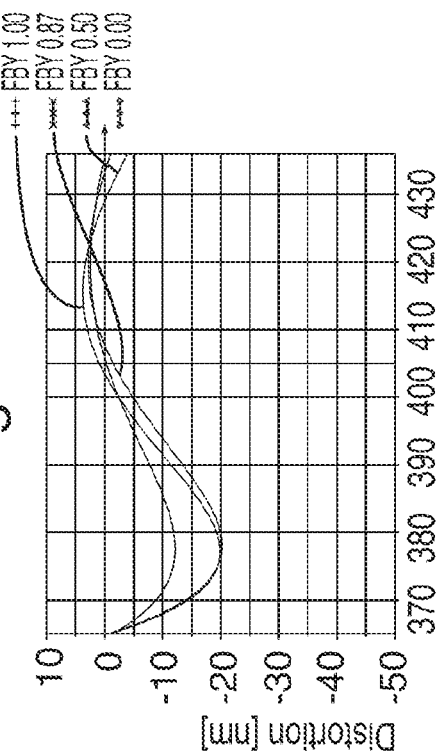
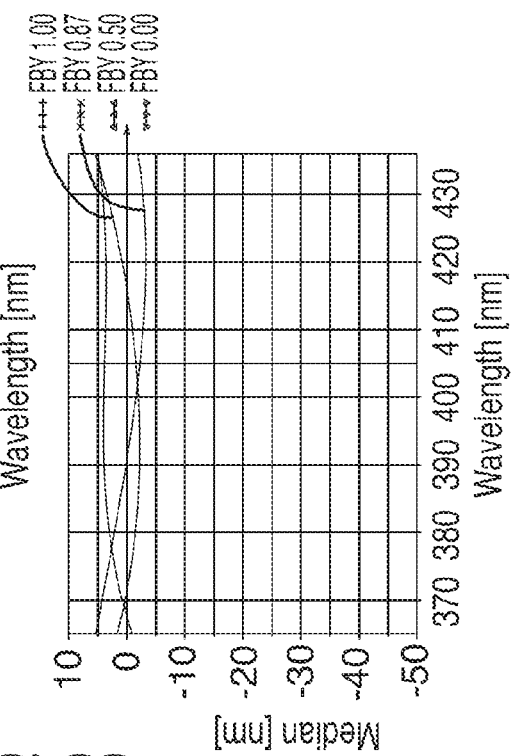
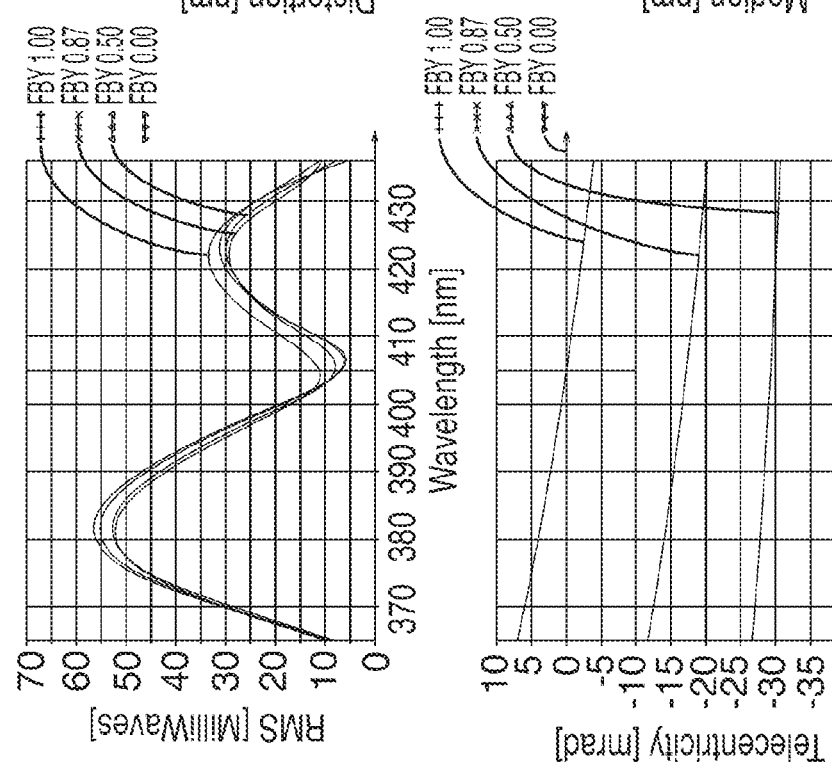
Fig. 7A  Fig. 7B  Fig. 7C  Fig. 7D

PROJECTION LENS, PROJECTION EXPOSURE APPARATUS AND PROJECTION EXPOSURE METHOD

FIELD

The disclosure relates to a refractive projection lens for imaging a pattern arranged in an object plane of the projection lens into an image plane of the projection lens via electromagnetic radiation of a mercury vapor lamp, a projection exposure apparatus equipped with the projection lens and a projection exposure method that can be carried out with the aid of the projection lens.

BACKGROUND

These days, microlithographic projection exposure methods are predominantly used for producing semiconductor components and other finely structured components, such as, e.g., photolithography masks. Here, use is made of masks (reticles) or other pattern generating devices, which carry or form the pattern of a structure to be imaged, e.g. a line pattern of a layer of a semiconductor component. The pattern is positioned in the region of the object plane of the projection lens between an illumination system and a projection lens in a projection exposure apparatus and illuminated by illumination radiation provided by the illumination system. The radiation modified by the pattern travels through the projection lens as projection radiation, the projection lens imaging the pattern onto the substrate to be exposed. The surface of the substrate is arranged in the image plane of the projection lens, which image plane is optically conjugate to the object plane. The substrate is generally coated with a radiation-sensitive layer (resist, photoresist).

Typically, the demands of the semiconductor component manufacturers are different for the exposure of critical and non-critical structures. The difference between these applications can be characterized, inter alia, by the typical structure widths and the desired properties with respect to exact positioning of the structures ("overlay"). Currently, critical structures, i.e., fine structures, are predominantly produced using modern immersion systems that operate with operating wavelengths in the deep ultraviolet range (DUV), in particular at approximately 193 nm. Image-side numerical apertures NA>1 can be achieved using immersion systems. In future, critical structures will also be exposed using EUV systems. This is understood to mean projection exposure apparatuses constructed using reflective components only, which operate with moderate numerical apertures at operating wavelengths in the extreme ultraviolet range (EUV) between approximately 5 nm and 20 nm, e.g., at approximately 13.4 mm. These systems are distinguished, inter alia, by high acquisition costs.

Non-critical structures, i.e., coarser structures, can be exposed using simpler and hence more cost-effective systems.

For the purposes of producing mid-critical or non-critical layers with typical structure dimensions of significantly more than 150 nm, work is conventionally carried out using projection exposure apparatuses that are constructed for operating wavelengths of more than 200 nm. In this wavelength range, use is usually made of refractive (dioptric) projection lenses, the production of which is easily controllable on account of their rotational symmetry about the optical axis.

These use cases have been employed for a long time, inter alia in projection exposure apparatuses for operating wavelengths of 365.5 nm±2 nm (so-called i-line systems). They use the i-line of a mercury vapor lamp, with the natural full bandwidth thereof being restricted with the aid of a filter, or in any other way, to a narrower used bandwidth $\Delta\lambda$, e.g., of approximately 4 nm. During the projection, ultraviolet light of a relatively broad wavelength band is used such that the projection lens must bring about a relatively strong correction of chromatic aberrations in order to ensure low-aberration imaging at the sought-after resolution, even with a broadband projection light.

In the case of dioptric projection lenses operated in broadband fashion, different lens element materials with sufficiently different dispersion properties are used for color correction (i.e., for the correction of chromatic aberrations), the lens element material having to be suitably distributed within the projection lens into regions with different ray height relationships in order to obtain the color correction. Transparent materials used in the typical i-line projection lenses include, in particular, fused silica ($SiO_2$) and the specialist glasses made commercially available under the designations FK5, LF5 and LLF1 by SCHOTT, Mainz, Germany. In these optical glasses, fused silica and the FK5 glass are typical representatives of glasses with relatively low dispersion (crown glasses), while the glasses LF5 and LLF1 are typical representatives of glasses with relatively high dispersion (flint glasses).

Refractive reduction lenses with a plurality of waists and bulges, inter alia, have proven their worth. The German patent application DE 102 21 386 A1 (corresponding to U.S. Pat. No. 6,806,942 B2) shows examples of three-bulge systems with a reducing effect and with NA>0.6. These have three bulges, each with positive refractive power overall, and two waists within lens element groups, each with negative refractive power overall, and use defined distributions of glasses with a high dispersion and glasses with a low dispersion for the color correction.

The use of catadioptric projection lenses, corrected in broadband fashion, for the operating wavelength range $\lambda$>200 nm has also already been proposed. EP 1 855 160 A2 (corresponding to US 2008117400 A1) describes exemplary embodiments of catadioptric projection lenses containing a concave mirror that is arranged in the region of a pupil surface of the projection lens, wherein a negative group including at least one negative lens element is arranged in the direct vicinity of the concave mirror in a near-pupil region with relatively large marginal ray heights. An advantage of such systems consists in the fact that, in principle, it is possible to realize a sufficient chromatic correction when using only a single lens element material, e.g., $SiO_2$. The increased outlay in the form of a catadioptric system can be considered to be a disadvantage.

SUMMARY

The disclosure seeks to provide a projection lens, a projection exposure apparatus and a projection exposure method, which facilitate the production of mid-critical or non-critical structures with a high throughput.

In an aspect, the disclosure provides a refractive projection lens for imaging a pattern arranged in an object plane of the projection lens into an image plane of the projection lens via electromagnetic radiation of a mercury vapor lamp. The projection lens includes a multiplicity of lens elements that are arranged along an optical axis between the object plane and the image plane and that are embodied in such a way that a pattern arranged in the object plane is imagable into the image plane with a reducing imaging scale by means of the lens elements. The lens elements include first lens elements made of a first material with a relatively low Abbe number and second lens elements made of a second material with a higher Abbe number relative to the first material. The projection lens includes exclusively the following lens element groups: a first lens element group with positive refractive power following the object plane; a second lens element group with negative refractive power following the first lens element group, for producing a waist around a region of minimal marginal ray heights between the object plane and the image plane; a third lens element group with positive refractive power following the second lens element group, between the second lens element group and a stop position suitable for attaching an aperture stop; and a fourth lens element group with positive refractive power, between the stop position and the image plane. The first and second lens elements are combined in such a way that imaging aberrations are corrected at the same time for wavelength ranges of at least two emission lines of the mercury vapor lamp.

In an aspect, the disclosure provides a projection exposure apparatus for exposing a radiation-sensitive substrate arranged in the region of an image plane of a projection lens with at least one image of a pattern of a mask arranged in the region of an object plane of the projection lens. The projection lens includes: a mercury vapor lamp for emitting radiation with emission lines at approximately 365 nm, approximately 405 nm and approximately 436 nm; an illumination system for receiving the light of the mercury vapor lamp and for forming illumination radiation directed onto the pattern of the mask; and a projection lens for imaging the structure of the mask onto a light-sensitive substrate. The projection lens is embodied as described herein.

In an aspect, the disclosure provides a projection exposure method for exposing a radiation-sensitive substrate with at least one image of a pattern of a mask. The method includes: providing a pattern between an illumination system and a projection lens of a projection exposure apparatus in such a way that the pattern is arranged in the region of the object plane of the projection lens; holding the substrate in such a way that a radiation-sensitive surface of the substrate is arranged in the region of an image plane of the projection lens optically conjugate to the object plane; illuminating an illumination region of the mask with an illumination radiation of a mercury vapor lamp provided by the illumination system; and projecting a part of the pattern lying in the illumination region onto an image field on the substrate with the aid of the projection lens, wherein all rays of the projection radiation contributing to the image generation in the image field form a projection beam path. The projection lens is embodied as disclosed herein.

In refractive reduction lenses according to the disclosure, aberrations are simultaneously corrected for at least two of the three wavelength ranges of the emission lines of a mercury vapor lamp. These wavelength ranges have centroid wavelengths at approximately 436 nm (g-line), approximately 405 nm (h-line) and approximately 365 nm (i-line). When using a projection lens according to the disclosure, a mercury vapor lamp can be used for exposure without spectral narrowing of the at least two employed emission lines. What can be achieved as a result of being able to use the light of at least two of the spectral lines is that the luminous energy in the system increases significantly in relation to a pure i-line system corrected only for the wavelength range of the i-line in the case of the same power of the radiation source, and consequently the preconditions for shorter exposure times and a higher throughput are provided.

The disclosure is based, inter alia, on the discovery that it may be expedient to make the imaging performance (provided, inter alia, by the image-side numerical aperture NA and the correction of the wavefront) subordinate to the throughput (e.g., quantifiable in wafers/hour) when imaging coarser structures.

Projection lenses according to the disclosure with a reducing effect (i.e., reduction lenses) achieve this goal using purely refractive means, as a result of which it is possible to use easily controllable techniques of lens construction. The projection lens may have a straight-line (unfolded) optical axis and uses no curved mirrors.

The construction of the known catadioptric systems for the operating wavelength range λ>200 nm uses an off-axis slot field with a low slot height. This leads to a use in a scanner. As a result, it is only possible to realize a relatively low throughput with increased system costs. This limitation is dispensed with in the case of refractive reduction lenses according to the disclosure.

Except for the specified lens element groups (first to fourth lens element group), projection lenses according to the disclosure have no further lens element groups such that a basic optical construction with a refractive power sequence "P—N-P-P" arises. Here, "P" represents a lens element group with positive refractive power overall and "N" represents a lens element group with negative refractive power overall. In the region of the second lens element group, the lens elements form a local constriction or waist of the projection beam path with a local minimum of the cross section of the projection beam path. In this case, the projection beam path contains the totality of all beams emanating from object field points that contribute to generating an image in the image field. Coming from the object plane, the cross section of the projection beam path tapers down to a local minimum within the second lens element group, and then it increases again in the direction of the third lens element group. Here, such projection lenses with the refractive power sequence P—N-P-P are also referred to as "one-waist systems". The "waist" is preferably situated in the object-side half of the projection lens, i.e., it is closer to the object plane than to the image plane. This basic design was found to be particularly advantageous in view of the presented problem.

The imaging aberrations are simultaneously corrected for wavelength ranges of at least two of the emission lines of the mercury vapor lamp. The term "corrected" means that the correction state in the region of those emission lines for which the aberrations are corrected is sufficiently good for low-aberration imaging of the relatively coarse structures to be imaged. In particular, the term "corrected" can also, for example, mean that the "Strehl definition brightness" is more than 95% and/or that the wavefront correction is better than 35 mλ.

What is important here is that the correction state may be significantly worse outside of those wavelength ranges for which the correction is optimized. In this respect, this is non-critical for the imaging performance because the mercury vapor lamp emits an approximately discontinuous spectrum and hence only relatively little radiation energy contributes to the overall imaging in the regions, not corrected as well or not corrected at all, away from the considered emission lines. Although it is possible to filter in the spectral regions between the emission lines, this can be dispensed with. Provision can be made of a bandpass filter, which transmits all used emission lines and which blocks spectral regions below the lowest employed wavelength and above the highest employed wavelength. In particular, there may be a sufficient correction state in the wavelength ranges of the at least two emission lines when a polychromatic RMS value of the wavefront aberration in the vicinity be observed spectral lines is no more than approximately 20 m$\lambda$, possibly also therebelow, for example at 15 m$\lambda$ or less.

By way of example, the projection lens may be corrected simultaneously for the i-line and the h-line, or corrected simultaneously for the h-line and the g-line, or corrected simultaneously for the i-line and the g-line, wherein the correction state for the respective third emission line is always substantially worse. In these cases, the projection lens can be referred to as an achromat.

Preferred embodiments are distinguished in that first and second lens elements are combined in such a way that imaging aberrations are corrected at the same time for wavelength ranges of three emission lines of the mercury vapor lamp at approximately 365 nm, approximately 405 nm and approximately 436 nm. Consequently, a mercury vapor lamp without spectral narrowing of the three emission lines can be used as a light source for exposure purposes. This means, in particular, that the luminous energy in the system increases significantly in relation to a pure i-line system and also in relation to an apochromatic system, which is only corrected for two of the three emission lines, in the case of the same lamp power. This provides good preconditions for obtaining shorter exposure times and higher throughputs.

In preferred embodiments, the projection lens has an image-side numerical aperture NA in the range of 0.3<NA<0.6. NA values from this range were found to be a particularly expedient compromise. In the case of image-side numerical apertures of significantly less than 0.3, it may become difficult to still image the finest structures within the sought-after structure range of relatively coarse structures. If the image-side numerical aperture is increased into the region of NA=0.6 or more, this greatly increases the outlay for producing the projection lens while a possible increase in resolution hardly brings about any practical use in view of the sought-after structure dimensions.

As reduction lenses, projection lenses according to the disclosure are designed to image the pattern of a reticle or any other pattern production device arranged in the object plane into the image plane with a reduced imaging scale. As a result, it is possible to use reticles or other pattern production devices, the structures of which are coarser than the structures to be produced on the exposed substrate. As a result of this, the costs for producing reticles can remain at moderate levels. Preferably, the imaging scale is 1:4 or less. By way of example, the imaging scale can be 1:4 ($|\beta|=0.25$) or 1:5 ($|\beta|=0.2$) or less. It is expedient for the projection lens to be designed in such a way that it can be operated with conventional reticles which, for example, can also be used with the aid of conventional i-line systems.

Preferably, the projection lens is designed in such a way that the imaging is corrected for an effective image field with an image height of 21 mm or more. This allows individual "dies" with standard dimensions of approximately 26 mm×33 mm to be exposed in a single exposure step in a step-and-repeat method, i.e., without scanning, during semiconductor manufacturing. In preferred applications, an optical correction for significantly greater image heights, for example more than 25 mm or more than 30 mm, is not required and not envisaged either in most projection lenses according to the disclosure. This can restrict the technological outlay for the correction of critical aberrations, such as the correction of the image field curvature (Petzval correction), for example.

It was found that the chromatic correction is able to be influenced particularly strongly in the case of a targeted use of positive-negative doublets with an achromatizing effect in the region around the stop position. Here, particular importance is placed on the type and distribution of lens elements in a stop region around the stop position, in which the condition CRH/MRH<0.3 applies for a ratio between a chief ray height CRH and a marginal ray height MRH of the imaging. In some embodiments, a plurality of positive-negative doublets with a positive lens element (converging lens element) made of a second material (relative crown material) and a negative lens element (diverging lens element) made of a first material (relative flint material) are arranged within the stop region. On account of the achromatizing effect, such positive-negative doublets are also referred to as achromat doublets here. Here, as a rule, the stop position lies at or near the only pupil plane of the projection lens, which is situated between the object plane and the image plane where the chief ray of the imaging crosses the optical axis. The stop region extends from the image-side end region of the third lens element group into the object-side entry region of the fourth lens element group and, in this respect, includes lens elements which, from an optical point of view, are arranged relatively close to the pupil plane.

Preferably, three, four or five positive-negative doublets with a positive lens element made of a second material and a negative lens element made of a first material are arranged within the stop region. Some or all positive-negative doublets in the stop region can directly follow one another without further lens elements being interposed. It was found that such a massive use of positive-negative doublets with an achromatizing effect promotes the correction of the longitudinal chromatic aberrations, in particular of the secondary spectrum.

Preferably, the second material is calcium fluoride ($CaF_2$) or any other second material (relative crown material) with anomalous partial dispersion in the range of the operating wavelengths in one, some or all positive-negative doublets within the stop region. Lens element materials with anomalous partial dispersion or anomalous dispersion are lens element materials with unusual dispersion. In particular, this means that the curve of the refractive index over the wavelength of the employed radiation deviates significantly from that of most other lens element materials in the considered wavelength range.

In some embodiments, the negative lens element consists of a first material (relative flint material) with anomalous partial dispersion in at least one positive-negative doublet in the stop region.

Using one or more lens elements made of a material with anomalous partial dispersion in combination with lens element materials with normal dispersion curves supports the option of obtaining a sufficient chromatic correction for radiation from all three emission lines of the mercury vapor lamp.

In some embodiments, provision is made for the positive lens element to consist of calcium fluoride (as relative crown material) and the negative lens element to consist of fused silica (as relative flint material) in at least one positive-negative doublet in the stop region. In this combination, the fused silica, which acts as relative crown material in combination with typical flint glasses, acts as a relative flint material.

Preferably, an asymmetric distribution of positive-negative doublets in relation to the stop position is provided within the stop region. By way of example, the number of positive-negative doublets within the fourth lens element group (i.e., between the stop position and image plane) can be greater than the number of positive-negative doublets within the third lens element group (between the waist and stop position).

In some embodiments, a positive lens element or converging lens element made of a first material (relative flint material) is arranged in the fourth lens element group in the vicinity of the image plane in a region of a low marginal ray height. In this region, the condition CRH/MRH>0.4 may apply to the ray height ratio CRH/MRH. As a result of using a converging lens element made of a first material in the region of low marginal ray heights in the vicinity of the image plane, a particularly effective correction means is provided for correcting the variation of the Petzval sum (or the image field curvature) with the wavelength.

By way of example, this converging lens element can be one of the last three lens elements of the projection lens in front of the image plane. The converging lens element preferably has a convexly curved entry surface and a concave exit surface, which may be advantageous in view of small angles of incidence at the lens element surfaces in the region near the image plane.

It is possible for the converging lens element made of relative flint material to be the last lens element with refractive power in front of the image plane. However, the converging lens element would be exposed to a higher radiation load here. Since many relative flint materials suitable for the converging lens element exhibit a tendency toward "lens heating", an optically free diameter of the converging lens element at the entry surface and the exit surface should preferably be greater than in the case of a lens element with a minimal optical free diameter within the projection lens. This can restrict the radiation load on this converging lens element.

A single lens element made of fused silica is arranged between the converging lens element and the image plane in some embodiments. This material is relatively resistant to "lens heating" and can therefore also be used in regions of high radiation load without substantial disadvantages for the imaging performance. As a result of inserting an individual lens element made of fused silica between the converging lens element made of a first material and the image plane, it is possible to keep the working distance in air low at the image side, i.e., between the last image-side lens element of the projection lens and the image plane, which has an advantageous effect on the correction options for aberrations.

In order to assist with the wavefront correction, a multiplicity of the lens elements are designed as aspherical lens elements with at least one rotationally symmetric aspherical optical surface (lens element surface) in numerous embodiments. By way of example, five, six, seven, eight, nine or ten aspherical lens elements may be provided. In many embodiments, at least 80% of the aspherical lens elements are manufactured from fused silica. In particular, 90% or more or all aspherical lens elements may consist of fused silica. This configuration is based on the discovery that the manufacture of aspherical surfaces is far more complicated from a technological point of view and more important in terms of quality than the manufacture of spherical lens element surfaces. If care is taken that use be made of materials that can be processed particularly well as a carrier of the aspherical surfaces, in particular fused silica, an effective correction of wavefront aberrations via aspherical surfaces can be obtained during manufacturing using well controllable technologies.

Various configurations are possible in the region of the only waist of the projection lens. By way of example, the second lens element group may consist exclusively of negative lens elements, for example exactly three negative lens elements. In some embodiments, a positive lens element is arranged in the second lens element group between an object-side first negative lens element and an image-side second negative lens element. As a result, the correction of aberrations can be assisted. In some embodiments, the positive lens element consists of fused silica, as a result of which it is possible, inter alia, for the design, in this respect, to be relatively insensitive to lens heating. It is also possible for the positive lens element to consist of a first material, i.e., a relative flint material. As a result, the chromatic correction, in particular, can be assisted.

In the one-waist systems according to the disclosure, it is possible to align the first lens element group which directly follows the object plane in respect of special correction tasks, without having to provide particular means for achromatization. By way of example, the first lens element group can be designed to make a relatively large contribution to setting the field dimensions, to correcting the distortions and to optimizing the telecentricity of the projection lens.

In some exemplary embodiments, a positive-negative doublet with a positive lens element made of a first material and a negative lens element made of a second material is arranged in the first lens element group. The positive-negative doublet can be arranged within the first lens element group (LG) between the object plane and a region of maximum marginal ray height, i.e., optically close to the object plane. Such a doublet may be provided directly following the object plane. The positive lens element can be arranged on the object side of the negative lens element, i.e., closer to the object plane. The assumption is made that the doublet contributes to the correction of the distortion and the chromatic variation of the Petzval sum by the flint positive lens element (in a manner analogous to the penultimate lens element).

It was found that there is a need for a better correction of the longitudinal chromatic aberration of the pupil imaging in some embodiments. The longitudinal chromatic aberration manifests itself as a chromatic variation of the deviation from telecentricity in the object space. In order to correct this chromatic variation, provision is made in some embodiments for a positive-negative doublet with a positive lens element made of a second material and a negative lens element made of a first material to be arranged in the first lens element group. This positive-negative doublet can be arranged within the first lens element group between the object plane and a region of maximum marginal ray height, i.e., relatively close to the object plane in the region of divergent radiation. The negative lens element can be arranged on the object side of the positive lens element, i.e., closer to the object plane. The positive-negative doublet can immediately follow the object plane. It is also possible for a weak refractive power lens element, for example a thin meniscus lens element, to be arranged between the object plane and the positive-negative doublet. A positive-negative doublet arranged in object-near fashion with a diverging lens element made of relative flint material and a converging lens element made of relative crown material provides a reticle-near achromat, by which a chromatic over-correction can be introduced, which counteracts the chromatic under-correction by the other lens elements of the system and which has an expedient effect on the correction of the longitudinal chromatic aberration of the pupil imaging.

According to another formulation of the disclosure, the projection lens can also be described as a refractive projection lens of the aforementioned structure (reducing one-waist system with a refractive power sequence P—N-P-P) for imaging a pattern arranged in an object plane of the projection lens into an image plane of the projection lens via electromagnetic radiation with an operating wavelength $\lambda > 200$ nm using at least two spectrally separated spectral lines of a radiation source at a first wavelength $\lambda_1$ and a second wavelength $\lambda_2 > \lambda_1$, wherein the condition $\Delta\lambda/\lambda > 0.05$ applies to a spectral bandwidth $\Delta\lambda = \lambda_2 - \lambda_1$ of the radiation at a mean wavelength $\lambda = (\lambda_1 + \lambda_2)/2$. By way of example, a simultaneous correction of the i-line and of the h-line would be captured for a mean wavelength of 385 nm. This would capture a simultaneous correction of the g-line and of the h-line for a mean wavelength of 420 nm, for example.

In particular, the condition $\Delta\lambda/\lambda > 0.1$ can apply here. This would capture a simultaneous correction of the i-line, of the h-line and of the g-line for a mean wavelength of 400 nm, for example.

The disclosure also relates to a projection exposure apparatus for exposing a radiation-sensitive substrate arranged in the region of an image plane of a projection lens with at least one image of a pattern of a mask arranged in the region of an object plane of the projection lens, including: a primary radiation source in the form of a mercury vapor lamp for emitting primary radiation; an illumination system for receiving primary radiation and for producing illumination radiation directed onto the mask; and a projection lens for producing at least one image of the pattern in the region of the image plane of the projection lens, wherein the projection lens is configured according to the disclosure.

Preferably, no filter for spectral narrowing of the bandwidth of one of the emission lines is assigned to the mercury vapor lamp such that a simplified structure arises in the region of the light source. The projection exposure apparatus can be designed as a wafer-stepper for a step-and-repeat process such that it is possible to dispense with devices for producing synchronized scan movements of the mask and substrate.

The disclosure also relates to a projection exposure method for exposing, via electromagnetic radiation of a mercury vapor lamp, a radiation-sensitive substrate arranged in the region of an image plane of a projection lens with at least one image of a pattern of a mask arranged in the region of an object plane of the projection lens. A projection lens according to the disclosure is used in the projection exposure method. In the case of a sufficiently large effective image field, individual dies of the substrate can be exposed without scanning in a step-and-repeat process via light of two or three of the emission lines of the mercury vapor lamp, lying at approximately 365 nm, approximately 405 mm and approximately 436 nm, as a result of which a high throughput per unit time can be realized.

BRIEF DESCRIPTION OF THE DRAWINGS

Further advantages and aspects of the disclosure are evident from the claims and from the following description of preferred exemplary embodiments of the disclosure, which are explained below with reference to the figures, in which:

FIG. 7 shows, in FIG. 7A to FIG. 7D, diagrams for explaining the correction state or the imaging performance of the exemplary embodiment of FIG. 6;

DETAILED DESCRIPTION OF THE EXEMPLARY EMBODIMENTS

Figure 1:
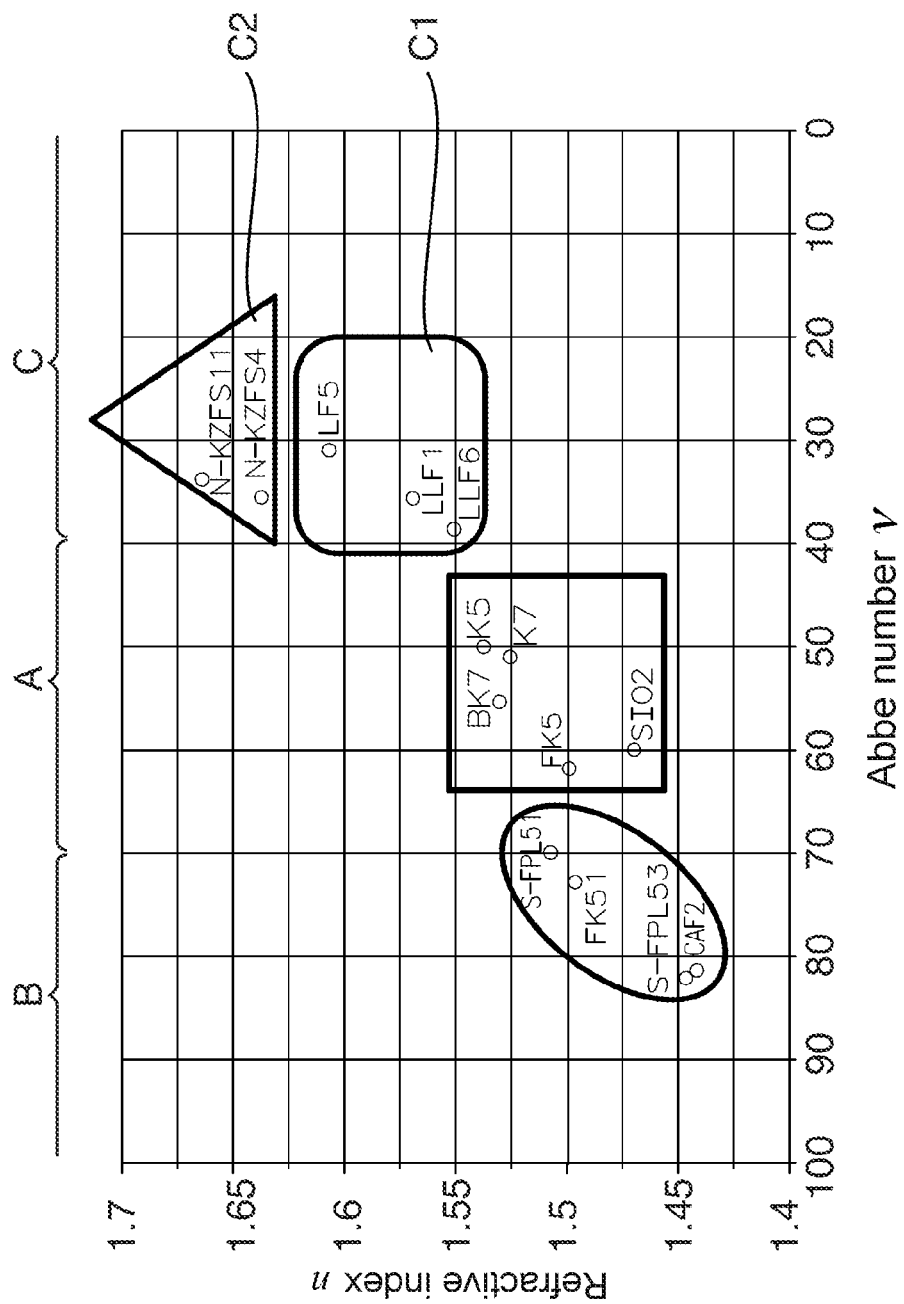
FIG. 1 shows a diagram with Abbe numbers and refractive indices of lens element materials for the wavelength range of the emission lines of a mercury vapor lamp.

Initially, observations in respect of chromatic aberrations and the correction thereof in dioptric (refractive) optical systems are presented in order to elucidate the terms used in this application and the meanings thereof.

Chromatic aberrations are imaging aberrations of optical systems that arise due to the fact that the refractive index n of transparent optical materials varies as a function of the wavelength $\lambda$. This dependence $dn/d\lambda$ is referred to as a dispersion of the optical material. In general, the refractive index of optical materials is greater for shorter wavelengths than for longer wavelengths.

Chromatic aberrations can be subdivided into various categories. A first category of chromatic aberrations takes account of the fact that a dedicated image is produced for each wavelength in the paraxial region (on the optical axis) and that these images may vary in respect of their position along the optical axis, their form and/or their size. The chromatic aberrations of the first category include the longitudinal chromatic aberrations CHL (axial chromatic aberration, axial color, AX) and the chromatic magnification aberrations or the chromatic difference of magnification CHV (lateral color LAT).

The longitudinal chromatic aberration is the longitudinal aberration of the image position or the paraxial focal position as a function of wavelength. If the refractive index for shorter wavelengths is greater than for longer wavelengths, the shorter wavelengths are refracted more strongly at each optical surface such that, for example in the case of a simple positive lens element, the rays of the relatively shorter wavelength are brought together at a focal position that lies closer to the lens element than the focus of the relatively longer wavelength. The paraxial distance along the optical axis of the lens element between the two focal points is the longitudinal chromatic aberration. If the rays with a shorter wavelength are focused closer to the imaging system than the rays of longer wavelength, the longitudinal chromatic aberration is usually referred to as "under-corrected" or "negative".

If an imaging system forms images with different sizes for different wavelengths or the image of an off-axis point forms a color fringe, a chromatic magnification aberration or a chromatic difference of magnification (CHV) is present. The chromatic difference of magnification can be quantified by the distance between the paraxial image heights of the different wavelengths.

The chromatic variation of the refractive index may also cause variations of monochromatic aberrations, which may be combined in a second category of chromatic aberrations. By way of example, these include the chromatic variation of the spherical aberrations, the chromatic aberration of the image field curvature, etc.

For a further characterization of possible aberrations, the imaging with light from a broadband radiation source is considered, the latter emitting light with different wavelengths around a central wavelength $\lambda$, wherein the radiation distribution is characterizable by a spectral bandwidth $\Delta\lambda$ (full width at half maximum). Typically, the extent of chromatic aberrations increases with increasing spectral bandwidth $\Delta\lambda$. Chromatic aberrations can be characterized with the aid of the focal positions for the different wavelengths along the optical axis for three wavelengths within the spectral bandwidth. The three wavelength components have the wavelengths $\lambda_1$, $\lambda_2$ and $\lambda_3$, where $\lambda_1 < \lambda_2 < \lambda_3$.

The size of the longitudinal chromatic aberration CHL then corresponds to the maximum length of the focal range along the optical axis into which the different wavelengths are focused. Typically, one of the wavelengths is focused closer to the imaging system than the other wavelengths. The distance between the closest focal position of the wavelengths and the focal position of the wavelengths furthest away corresponds to the magnitude of the longitudinal chromatic aberration of the imaging system for the broadband light source. The focal position of the central wavelength $\lambda$ along the optical axis can be considered to be the image plane within the focal range.

In the art, this situation is also described as a "primary spectrum" being present. The primary spectrum can often be corrected by combining converging and diverging lens elements that consist of different optical materials with different dispersion. More specifically, it is possible to correct the longitudinal chromatic aberration in such a way that the focal planes for two different wavelengths coincide on the optical axis. Once the primary spectrum has been corrected, the wavelengths $\lambda_1$ and $\lambda_3$, for example, can be focused at a common axial position. Such optical imaging systems are also referred to as an "achromat" in this application.

As a rule, a longitudinal chromatic aberration remainder remains for other wavelengths that are not captured by the correction. These remains of the longitudinal chromatic aberration are also referred to as the "secondary spectrum" and describe the deviation from the image plane of the focal position of all other wavelengths of the wavelength band. In some cases, it is also possible to correct the secondary spectrum by a suitable choice of optical materials, lens element dimensions, distances and refractive powers, etc. The secondary spectrum may possibly be corrected to such an extent that the focal positions of all three wavelengths $\lambda_1$, $\lambda_2$ and $\lambda_3$ of the considered wavelength range lie at the same axial position. In this application, an optical system where the secondary spectrum is also corrected is also referred to as an "apochromat".

Expressed differently, the longitudinal chromatic aberration for two spaced apart wavelengths becomes very small (possibly down to a value of zero) in the case of an achromatic imaging system. The longitudinal chromatic aberration for three spectrally spaced apart wavelengths becomes very small (possibly down to a value of zero) in the case of an apochromatic optical imaging system.

In dioptric projection lenses that are intended to operate with spectrally broadband light sources, different lens element materials with Abbe numbers with differences that are as large as possible are used for the correction of chromatic aberration. The Abbe number v facilitates a characterization of the dispersion properties of a material in a wavelength range of interest. By way of example, the Abbe number of a material can be calculated using the following formula:

$$v = (n_2 - 1)/n_1 - n_3),$$

where $n_1$, $n_2$ and $n_3$ are the refractive indices of the material at wavelengths of $\lambda_1$, $\lambda_2$ and $\lambda_3$, and $\lambda_1 < \lambda_2 < \lambda_3$ applies. In general, low Abbe numbers represent materials with a relatively strong dispersion and high Abbe numbers represent materials with a relatively weak dispersion. Therefore, the Abbe number is sometimes also referred to as "reciprocal relative dispersion".

Lens element materials for operating wavelengths at emission lines of a mercury vapor lamp can be divided into three different groups, depending on their refractive index and their Abbe number (cf., FIG. 1). A first group, referred to as group A, includes those materials whose Abbe number is found in the range from 40 to 70. Here, the Abbe number is calculated for the wavelengths of $\lambda_1 = 365.01$ nm, $\lambda_2 = 404.65$ nm and $\lambda_3 = 435.84$ nm, which correspond to the wavelengths of the i-, h- and g-emission lines of a mercury vapor lamp. The materials in group A have typical refractive indices in the range from 1.46 to 1.56. The materials of group A include, inter alia, fused silica ($SiO_2$) and various borosilicate glasses, such as, e.g. BK7 glass or the glasses K5, K7 or FK5.

A second group, referred to as group B, includes materials with Abbe numbers of greater than 70. Some materials in group B, such as, e.g., crystalline calcium fluoride (fluorspar or $CaF_2$), have a refractive index of less than 1.46.

A third group, referred to as group C, includes materials with Abbe numbers of less than 40. The materials of group C have refractive indices of more than approximately 1.56. The materials of group C include, inter alia, typical flint glasses such as LLF-6 glass, LLF-1 glass or LF-5 glass. These can be assigned to a subgroup C1, the materials of which have a refractive index of no more than 1.62. A subgroup C2 of this group C includes materials with a very high refractive index of more than approximately 1.62. By way of example, this includes high-index flint glasses such as N-KZFS4.

For the purposes of reducing chromatic aberrations by refractive means, an optical system should have lens elements made of at least two materials with different dispersions or different Abbe numbers. Thus, first optical elements made of a first material with a relatively low Abbe number and second optical elements made of a second material with a higher Abbe number relative to the first material should be combined. Within the scope of this application, first materials with a relatively low Abbe number are also referred to as "relative flint materials" and second materials with a relatively higher Abbe number are also referred to as "relative crown materials".

As a rule, lens element materials of group B are used as relative crown materials. As a rule, lens element materials of group C are used as relative flint materials. Lens element materials of group A can act as relative crown material in combination with a material of group C and as relative flint material in combination with a material of group B. By way of example, in combination with a material of group C (e.g., LF5, LLF1, LLF6), fused silica ($SiO_2$) acts as a relative crown material. By contrast, if fused silica is combined with a material of group B, for example $CaF_2$, the fused silica acts as a relative flint material.

In the following description of preferred embodiments, the term "optical axis" denotes a straight line through the centers of curvature of the curved lens element surfaces. In the examples, the object is a mask (reticle) with the pattern of an integrated circuit; it may also relate to a different pattern, for example of a grating. In the examples, the image is projected onto a wafer provided with a photoresist layer, the wafer acting as a substrate. Other substrates are also possible, for example elements for liquid crystal displays or substrates for optical gratings.

Some peculiarities can be elucidated on the basis of the profiles and the relationships between chief rays and marginal rays of the imaging. Here, a chief ray CR refers to a ray that extends from an edge point of the object field in parallel with, or at an acute angle to, the optical axis and that intersects the optical axis in the region of a pupil plane. A marginal ray MR within the meaning of the present application leads from the center of the object field to the edge of the aperture stop. The perpendicular distance of these rays from the optical axis yields the corresponding ray height. To the extent that this application refers to a "marginal ray height" (MRH) or a "chief ray height" (CRH), this refers to the paraxial marginal ray height and the paraxial chief ray height, respectively.

The specifications of the exemplary embodiments shown in the drawings are quoted at the end of the description.

Figure 2:
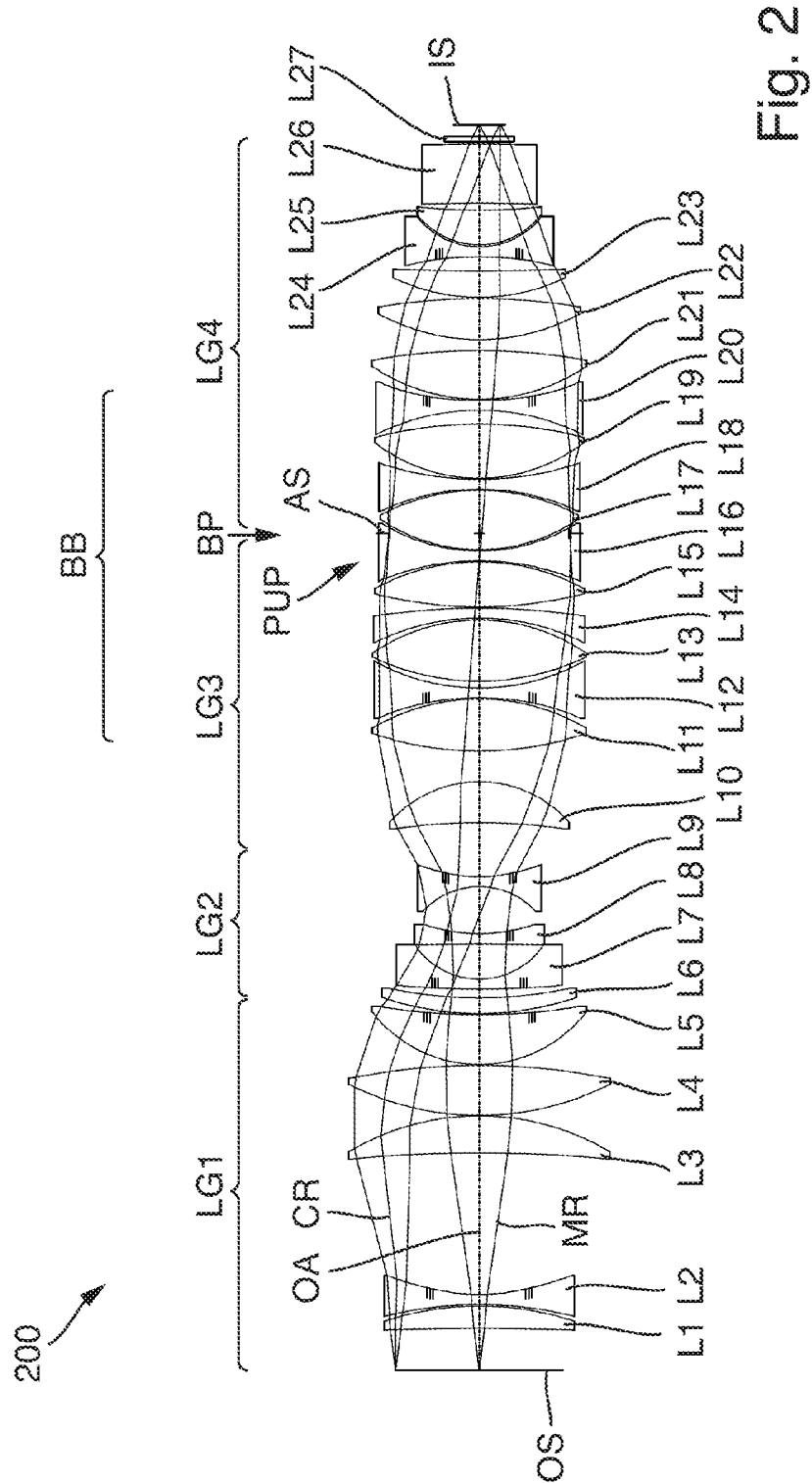
FIG. 2 shows a schematic meridional lens element sectional view of a projection lens according to a first exemplary embodiment.

FIG. 2 shows a schematic meridional lens element sectional view of a first exemplary embodiment of a refractive projection lens 200 with selected beams for elucidating the imaging beam path or the projection beam path of the projection radiation passing through the projection lens during operation.

The projection lens is provided as an imaging system with a reducing effect, for imaging a pattern of a mask arranged in its object plane OS onto its image plane IS aligned parallel to the object plane directly, i.e., without producing an intermediate image, and with a reduced scale, for example with the scale of 4:1.

Between the object plane and the image plane, the only pupil plane PUP of the imaging system lies where the chief ray CR of the optical imaging intersects the optical axis OA. The aperture stop AS of the system is attached in the region of the pupil plane. Therefore, the position suitable for attaching the aperture stop is also referred to as stop position BP here. A stop region BB extends around the stop position, the condition CRH/MRH<0.3 applying to a beam height ratio between the chief ray height CRH and the marginal ray height MRH of the imaging in the stop region. Thus, the marginal ray height is relatively large in relation to the chief ray height. The optical structure can be characterized as follows:

A first lens element group LG1 with positive refractive power and a total of six lens elements L1 to L6 immediately follows the object plane OS. The first lens element group collects the rays coming from the field points of the object plane and, as a result, forms a bulge in the projection beam path.

A second lens element group LG2 with negative refractive power immediately follows the first lens element group LG1. This second lens element group includes the three lens elements L7, L8 and L9 and produces a waist around a local minimum of the marginal ray height between the object plane OS and the image plane IS in the projection beam path.

A third lens element group LG3 with positive refractive power and a total of seven lens elements L10 to L16 immediately follows the second lens element group LG2. The lens elements of the third lens element group are arranged between the second lens element group LG2 and the stop position suitable for attaching an aperture stop AS.

A fourth lens element group LG4 with positive refractive power overall is situated between the stop position and the image plane IS. The fourth lens element group includes nine lens elements L17 to L26 with refractive power, and a thin plane plate L27 immediately in front of the image plane IS.

A total of five different lens element materials are used for the lens elements of the projection lens 200. The lens elements L2, L4, L5, L7, L8, L9, L12, L20, L24, L26 and L27 consist of fused silica ($SiO_2$), i.e., a material of group A in FIG. 1 with an Abbe number of v 60. The lens elements L10, L11, L13, L15, L17, L19, L21 and L22 consist of calcium fluoride ($CaF_2$), i.e., a crystalline lens element material of group B in FIG. 1 with a relatively high Abbe number of v≈82. The lens elements L1, L3, L6, L23 and L25 consist of the lens element material denoted LLF1, i.e., a lens element material of group C or subgroup C1 with a relatively low Abbe number of v≈36. The lens elements L16 and L18 consist of the lens element material denoted N-BK7, i.e., a lens element material of group A in FIG. 1 with an Abbe number of v≈56. The lens element L14 consists of a lens element material denoted LF5, i.e., a lens element material of group C or subgroup C1 in FIG. 1 with a relatively low Abbe number of v≈31.

The lens elements consequently include first lens elements made of a first material with a relatively low Abbe number and second lens elements made of a second material with a higher Abbe number relative to the first material. Here, the first material is referred to as "relative flint material" in each case, the second material as "relative crown material". The first and the second lens elements are combined in such a way that imaging aberrations are corrected at the same time for wavelength ranges of all three emission lines of a mercury vapor lamp. The imaging performance will still be explained below on the basis of FIGS. 3A to 3D.

In the exemplary embodiment of FIG. 2, a substantial component of the correction of the longitudinal chromatic aberration CHL, more particularly of the secondary spectrum, is ensured by a massive use of achromat doublets in the stop region BB. An "achromat doublet" is a positive-negative doublet with a positive lens element made of a second material (relative crown material) and a negative lens element made of a first material (relative flint material).

A total of five positive-negative doublets are arranged in stop region BB, specifically the lens element pairs L11/L12, L13/L14, L15/L16, L17/L18 and L19/L20. In each positive-negative doublet, a biconvex positive lens element made of a relative crown material is paired with a subsequent negative lens element (either a biconcave lens element or a meniscus lens element) made of a relative flint material. All biconvex positive lens elements of the positive-negative doublet consist of calcium fluoride in the exemplary case, i.e., a relative crown material of group B. In the positive-negative doublets L11/L12, L15/L16, L17/L18 and L19/L20, this is combined with a material of group A, which acts as a relative flint material, with the biconcave negative lens elements L12 and L20 consisting of fused silica while the biconcave negative lens elements L16 and L18 consist of N-BK7.

In this variant, calcium fluoride acts as material with anomalous partial dispersion and can be paired in the specified wavelength range with N-BK7, for example, in such a way that the secondary spectrum is precisely corrected for the three wavelength ranges considered here of the g-, h- and i-line of the mercury vapor lamp.

In order to further improve the matching to the wavelengths, a negative meniscus lens element L14 made of the relative flint material LF5 (a material of group C) is used in the positive-negative doublet L13/L14.

As a result of the consistent use of flint material in the diverging lens elements and crown material in the converging lens elements of the stop region, the Petzval sum varies with the wavelength. This can be understood as follows: The contribution of a thin lens element to the Petzval sum P is given by the refractive power $\varphi$ of the lens element divided by its refractive index n:

$$P = \frac{\varphi}{n} = \Delta\rho\frac{n-1}{n}$$

where $\Delta\rho = 1/r_1 - 1/r_2$ is the difference of the curvatures of the lens element surfaces. If the wavelength is changed, there is a change in the refractive index of the lens element, and hence also in the contribution to the Petzval sum:

$$\frac{dP}{d\lambda} = \Delta\rho\frac{d}{d\lambda}\left(\frac{n-1}{n}\right) = \Delta\rho\left(\frac{n-(n-1)}{n^2}\right)\frac{dn}{d\lambda} = \frac{\Delta\rho}{n^2}\frac{dn}{d\lambda}$$

Thus, the change in the Petzval contribution of a lens element is proportional to the change in the refractive index (dispersion). Accordingly, the contribution of the negative (over-correcting) flint lens elements to the Petzval sum increases more strongly than that of the positive (under-correcting) crown lens elements. As a consequence, the Petzval sum will vary with wavelength.

This effect, unwanted per se, is counteracted in the exemplary embodiment by virtue of converging lens elements (positive lens elements) being replaced by lens elements made of a relative flint material at those points within the projection lens where they only have little effect on the longitudinal chromatic aberration. Such regions are characterized by relatively low marginal ray heights and therefore lie either relatively close to the object plane or close to the image plane. Hence, it should be understood that a high refractive power, converging positive lens element made of a relative flint material, specifically the penultimate positive meniscus lens element L25 with refractive power, which consists of LLF1 (material of group C1), is situated in the vicinity of the image plane IS, i.e., at already relatively low marginal ray heights.

An even better correction of the Petzval sum could be obtained if this positive lens element made of flint material were to lie even closer to the image plane, i.e., in the region of even lower marginal ray heights. However, since experience of the inventor points to flint lens elements tending to cause lens heating, care was taken in the exemplary embodiment that all lens elements made of a material of group C (flint material) are arranged in such a way that a minimum optical free diameter in the beam path is not undershot such that the radiation exposure of these lens elements does not become too high. In particular, a last lens element directly in front of the wafer should not consist of a flint material of the group C.

However, in order not to let the working distance in air become too large in the vicinity of the image plane (this was found to be disadvantageous for the correction of aberrations), the region between the converging flint lens element L25 and the image plane is to a larger part filled with a lens element with little refractive power and made of a lens element material that is resistant to lens heating, a thick lens element L26 made of fused silica in the exemplary case.

Two converging flint lens elements, i.e., positive lens elements made of a relative flint material, are situated in the first lens element group LG1, specifically the lens elements L1 and L3. These converging flint lens elements in the front part of the projection lens predominantly correct the transverse chromatic aberration (CHV).

FIG. 3 illustrates the imaging performance of the considered projection lens. FIG. 3A (top left) plots the RMS value of the wavefront aberrations for four field points (field center, half field, 87% field height and field corner) over the wavelength. It is possible to identify that the wavefront aberration in the vicinity of the considered spectral lines is no more than approximately 15 mλ to 18 mλ and consequently foreseeably sufficiently corrected for the application.

Figure 3A:
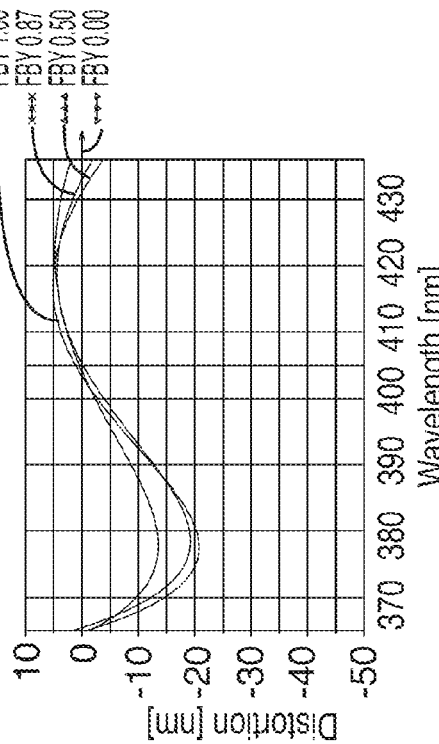
FIG. 3 shows, in FIG. 3A to FIG. 3D, diagrams for explaining the correction state or the imaging performance of the exemplary embodiment of FIG. 1.
Figure 3B:
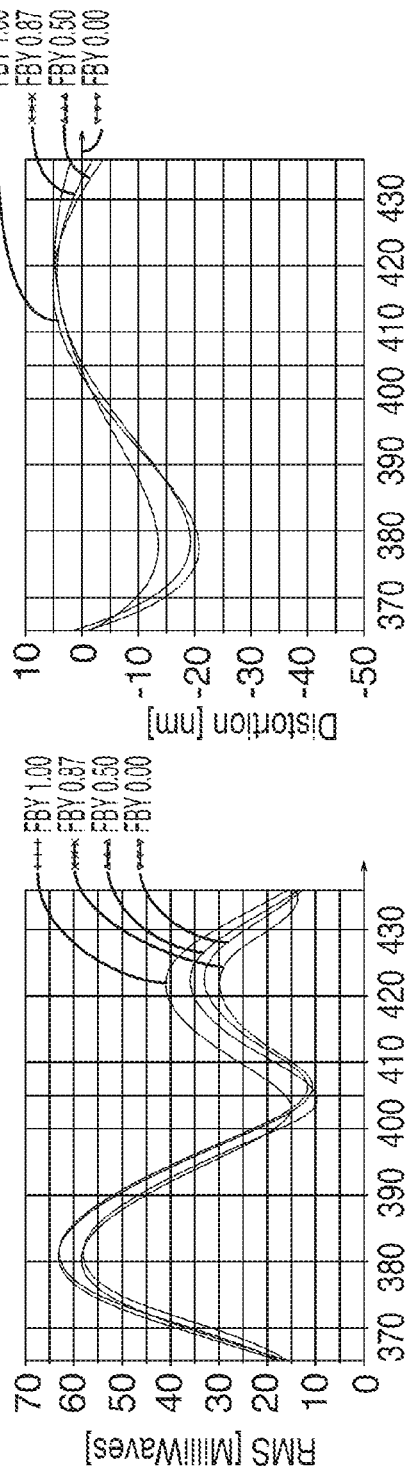

In FIG. 3B (top right), the chief ray distortion of the design is plotted at the various field points, once again over the wavelength. Here too, a very good correction of less than ±5 nm arises in the vicinity of the observed spectral lines.

Figure 3C:
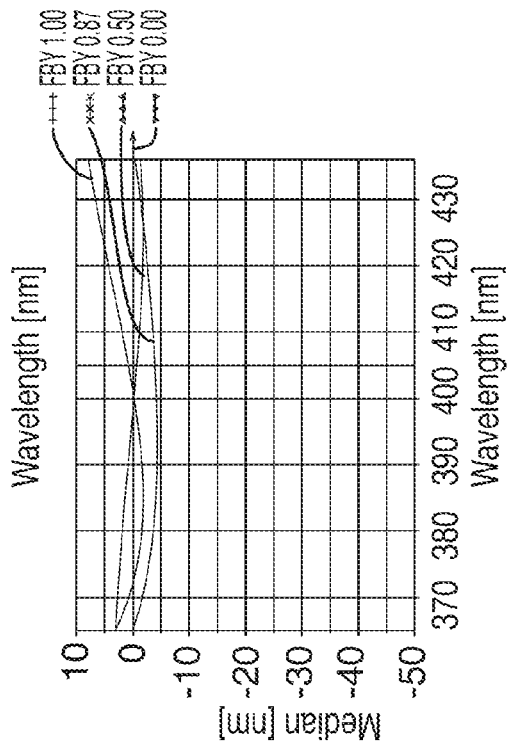

FIG. 3C (bottom left) plots the profile of the deviation from the entry telecentricity for the four field points already mentioned over the wavelength. Initially, it is possible to identify that the deviation of the entry pupil position from the telecentricity has a strong correlation with the field angle. Thus, for example, the chief ray of the half field height deviates from the telecentricity by approximately 30 mrad at the telecentric field edge. This zone error of the telecentricity is a known problem of dioptric systems and can only be corrected with very much effort, not performed here, going into the optical design.

The next property that can be identified is that the deviation from telecentricity depends strongly on the wavelength at all field points. Thus, the chief ray of the field edge of the reticle (in the object plane) diverges at short wavelengths (negative entry pupil position) while it converges toward the optical axis (positive entry pupil position) at long wavelengths.

Both the zone error of the telecentricity (which results from an under-corrected spherical aberration of imaging the stop into the object space) and the chromatic variation of the entry pupil position (arising from the under-corrected longitudinal chromatic aberration of the same imaging) should be provided for in suitable fashion in the illumination system for this embodiment.

Figure 3D:
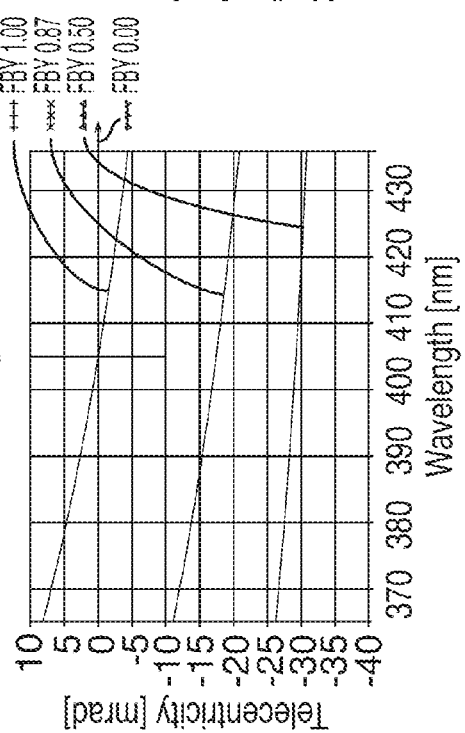

Finally, FIG. 3D (bottom right) illustrates the variation of the median with the field angle and the wavelength. This also predominantly lies in the range of ±5 nm and appears sufficiently corrected. The median is the offset of the centroid of the intersection diagram in the image plane of the chief ray and consequently is a measure for the coma image aberration.

In principle, $CaF_2$ in the vicinity of the stop can also be replaced by any other suitable material of group B with anomalous partial dispersion, e.g. by N-FK51, S-FPL51 or S-FPL53.

Likewise, the correction of the secondary spectrum can conceivably be further supported by materials with anomalous partial dispersion in the diverging lenses, for instance N-KzFS4, N-KzFS11 or S-NBM51, which are all in subgroup C1.

The design contains a total of eight aspherical surfaces that assist the correction of the aberrations (see surfaces with dash triplets in FIG. 1). Manufacturing aspherical surfaces is much more complicated and important in terms of quality than manufacturing spherical surfaces. Therefore, care was taken to use easily processable materials as substrates of the aspherical surfaces. In the exemplary case, the aspherical surfaces are exclusively applied to quartz lens elements.

Figure 4:
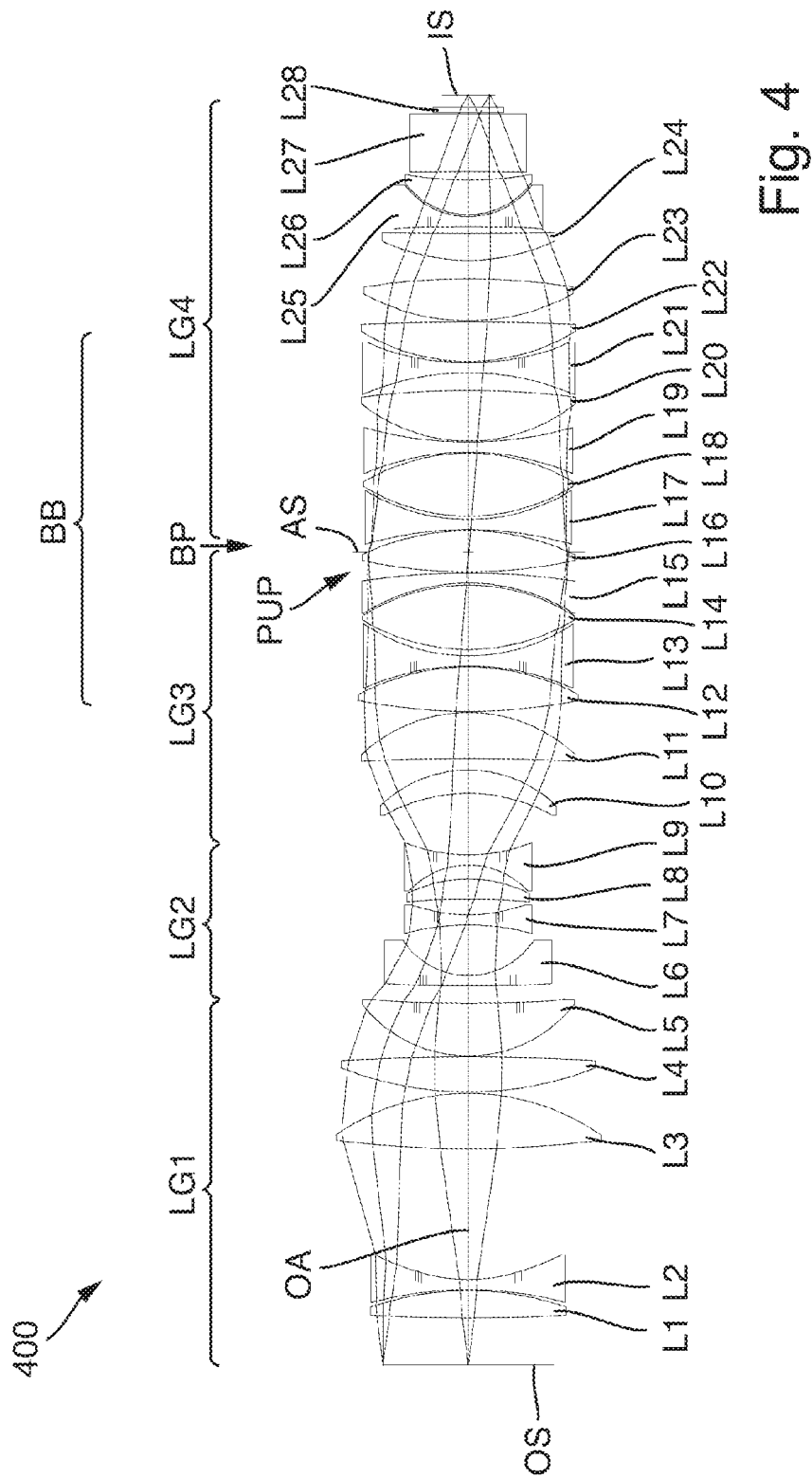
FIG. 4 shows a schematic meridional lens element sectional view of a projection lens according to a second exemplary embodiment.

FIG. 4 shows a schematic meridional lens element section of a second exemplary embodiment of a refractive projection lens 400. The sequence of lens element groups and refractive powers is the same as in the first exemplary embodiment, which is why reference is made to the description thereof in this respect. In particular, the projection lens 400 also has a total of five positive-negative doublets (achromat doublets) with achromatizing effect and with a positive lens element made of relative crown material (calcium fluoride in the example) and a subsequent negative lens element made of relative flint material within the stop region BB, specifically the lens element pairs L12/L13, L14/L15, L16/L17, L18/L19 and L20/L21.

There are noticeable differences in predominantly two aspects. Firstly, only the material LLF1 is used (in lens elements L1, L4, L15, L24 and L26) as a relative flint material of group C or subgroup C1. Thus, the negative meniscus lens element L15 of the second positive-negative doublet consists not of LF5 but of LLF1, unlike the negative meniscus lens element L14 of the second positive-negative doublet of the first exemplary embodiment. Although LF5, used in the first exemplary embodiment, is more expedient in view of correcting chromatic aberrations, however, it exhibits a significantly higher sensitivity to lens heating. In this respect, the second exemplary embodiment is more stable in relation to aberrations caused by lens heating.

Moreover, a converging quartz glass lens element L8 (object-side concave positive meniscus lens element) is inserted into the second lens element group LG2 in the region of the waist such that the second lens element group LG2, overall having the effect of negative refractive power, includes a lens element material that is relatively stable against lens heating in the region of the smallest marginal ray heights, which further assists the correction of the aberrations in combination with the other lens elements (negative lens elements) of the second lens element group LG2.

Figure 5:
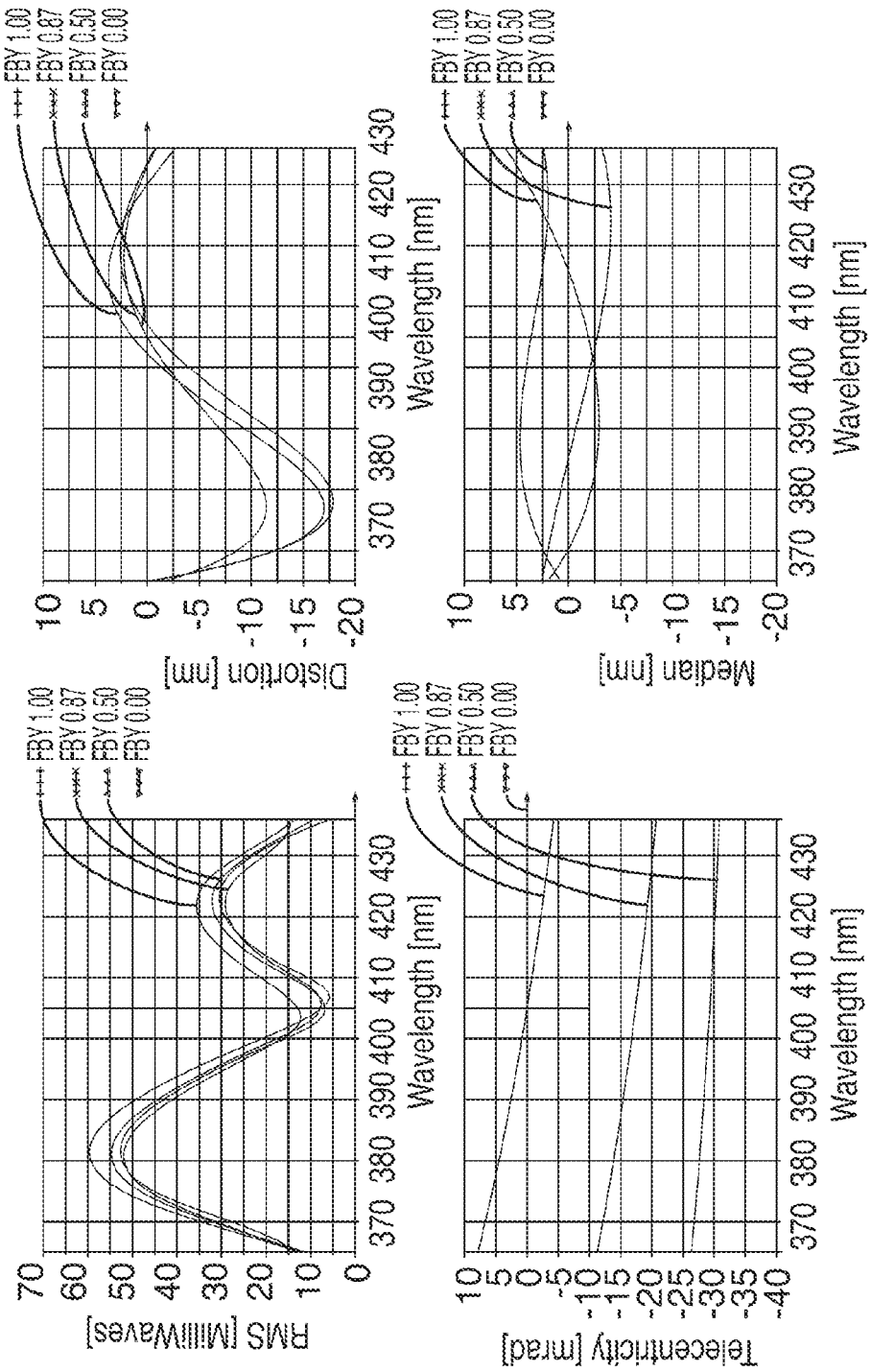
FIG. 5 shows, in FIG. 5A to FIG. 5D, diagrams for explaining the correction state or the imaging performance of the exemplary embodiment of FIG. 4.

In FIG. 5, the parameters characteristic for the imaging performances are plotted in partial FIGS. 5A to 5D in a manner analogous to FIG. 3. It is possible to identify that the RMS value of the wavefront correction (FIG. 5A) and the chief ray distortion (FIG. 5B), in particular, have slightly improved in relation to the first exemplary embodiment.

Figure 6:
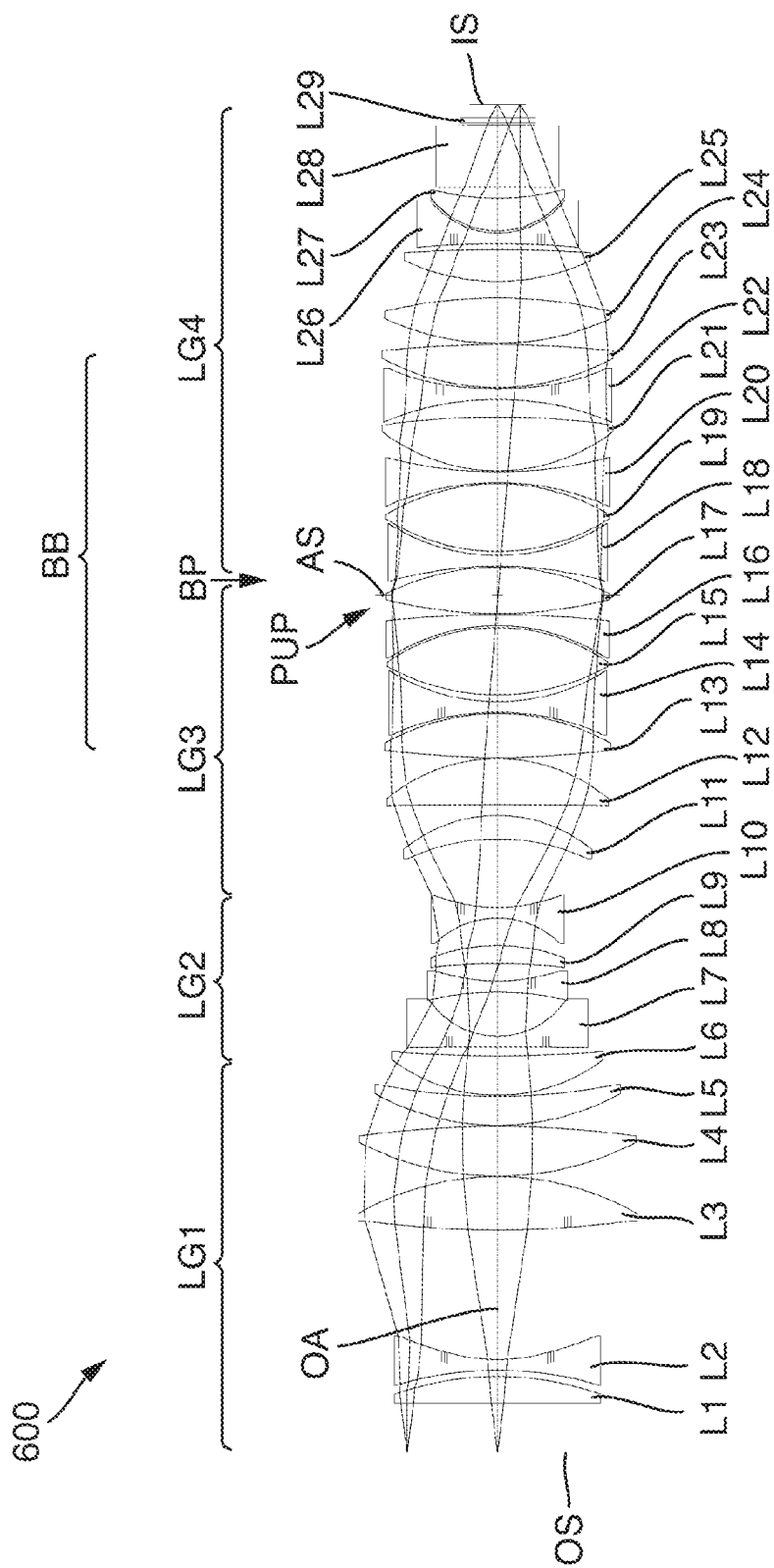
FIG. 6 shows a schematic meridional lens element sectional view of a projection lens according to a third exemplary embodiment.

FIG. 6 shows a schematic meridional lens element section of a third exemplary embodiment of a refractive projection lens 600, which can be considered to be a modification of the first and second exemplary embodiment. The basic structure with the sequence of lens element groups and refractive powers (refractive power sequence P—N-P-P) and the configuration as a one-waist system are clearly identifiable. Five immediately successive positive-negative doublets with achromatizing effect, specifically lens element pairs L13/L14, L15/L16, L17/L18, L19/L20 and L21/L22, are situated within the stop region BB. Like in the second exemplary embodiment, a positive lens element with a converging effect, specifically the positive meniscus lens element L9, is situated within the second lens element group LG2 with negative refractive power, in the region of the smallest marginal ray height between two biconcave negative lens elements L8 and L10. An improvement in the chromatic correction in relation to the second exemplary embodiment can be obtained by virtue of this additional converging lens element in the waist (negative second lens element group) not consisting of fused silica but consisting of a relative flint material of group C, specifically LLF1. The greater chromatic correction obtainable therefrom is expressed in the quantitative evaluation of the imaging performance, which is specified in FIG. 7 on the basis of partial FIGS. 7A to 7D, in a manner analogous to the illustrations in FIGS. 3 and 5.

Figure 8:
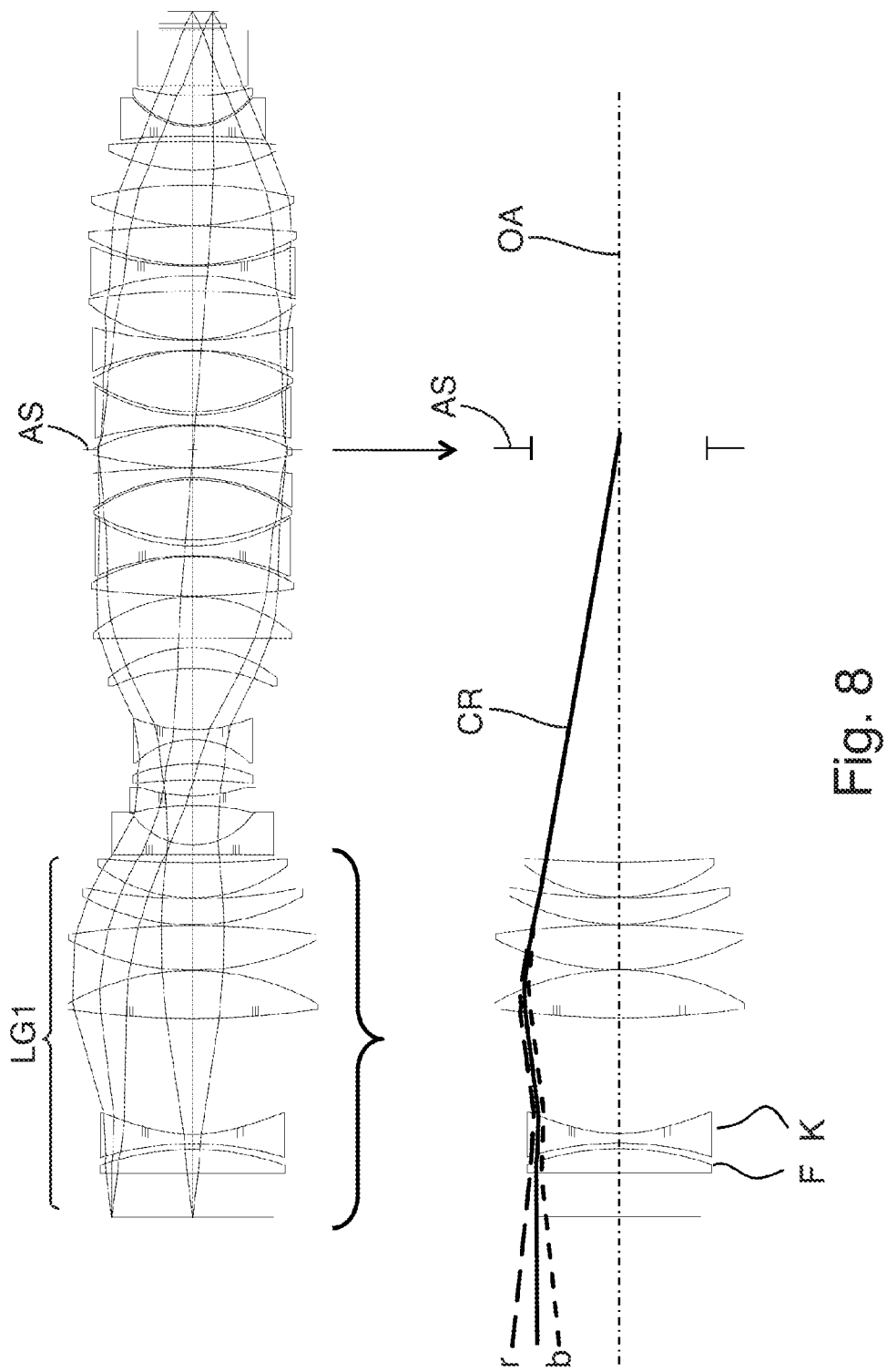
FIG. 8 shows the exemplary embodiment of FIG. 6 in the upper partial figure and schematic beam profiles for explaining the chromatic correction of the pupil imaging in the lower partial figure.

What is common to all three embodiments illustrated in detail up until now is that the deviation of the field points from the telecentricity varies with the light wavelength in each case. As already mentioned, this is mainly due to the fact that no separate measures have been taken to correct the longitudinal chromatic aberration of the pupil imaging. This relationship is explained in more detail on the basis of FIG. 8.

The entry pupil of a projection lens is the image of the system stop (defined by the aperture stop AS) in the object space. This imaging is predominantly undertaken by the lens elements between the object plane OS and the stop position, where the chief ray (corresponding to the marginal ray of the pupil imaging) has a relatively large beam height. Consequently, the entire system can be imagined to be replaced by the diverging lens elements and converging lens elements lying relatively close to the object plane. This is schematically illustrated in the lower partial image of FIG. 8. If the imaging is considered in more detail, it is possible to identify that the chief ray CR is imaged into the object space in chromatically under-corrected fashion by the multiplicity of converging lens elements within the first lens element group LG1. Moreover, a positive-negative doublet (lens elements L1 and L2) with a slight diverging effect is arranged in the vicinity of the object plane OS, in which doublet the negative lens element (diverging lens element) consists of a relative crown material (K) and the converging lens element (positive lens element) consists of a relative flint material (F). This achromat doublet (i.e., this positive-negative doublet with achromatic effect) leads to a further, significant chromatic under-correction of the pupil imaging. As a consequence thereof, the longer wavelength chief ray (symbol r in FIG. 8) will cause a real entry pupil position in the object space while the shorter wavelength chief ray (symbol b in FIG. 8) will cause a virtual entry pupil position.

Figure 9:
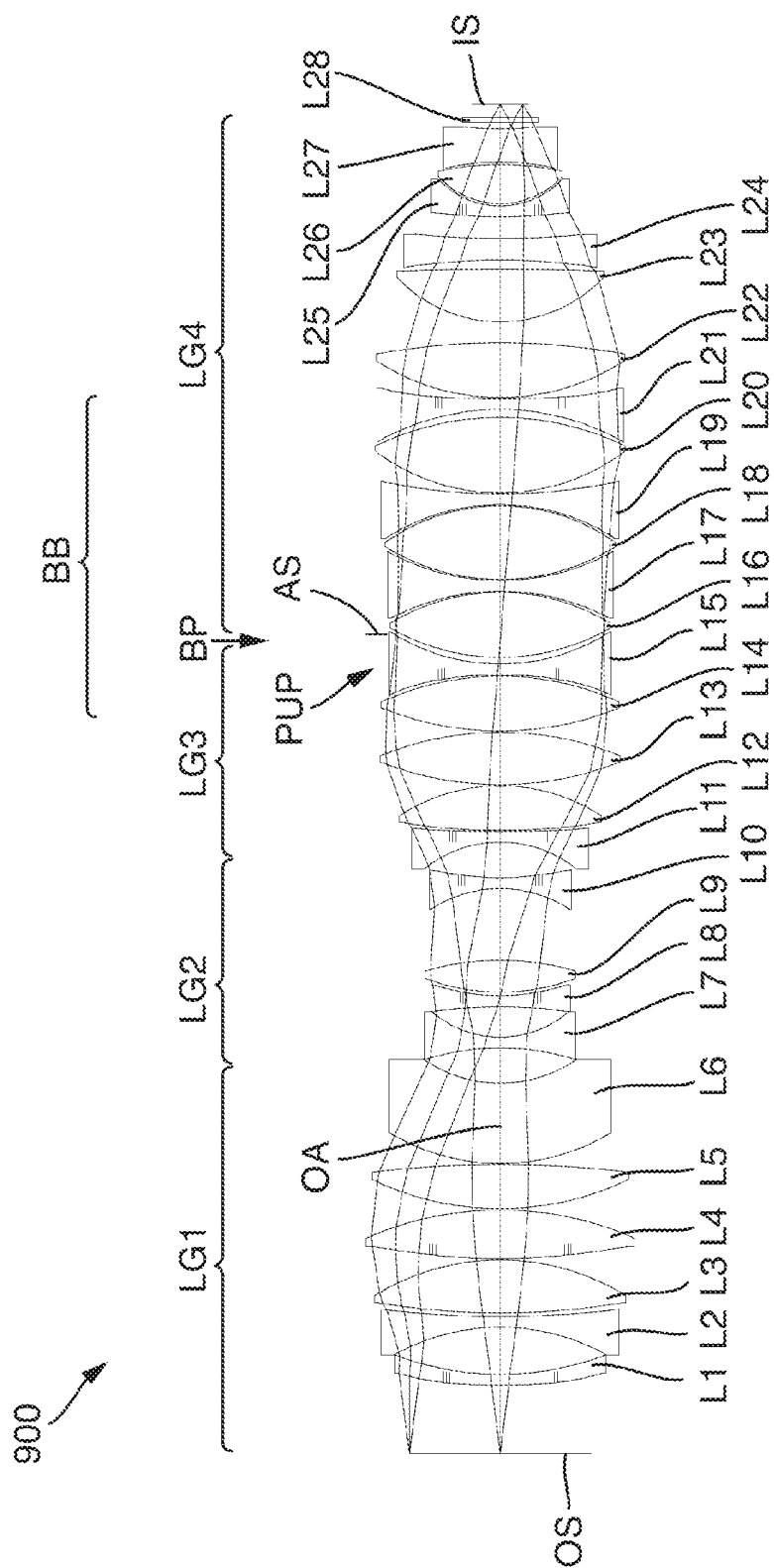
FIG. 9 shows a schematic meridional lens element sectional view of a projection lens according to a fourth exemplary embodiment.

If this chromatic variation should be corrected, there should be chromatic over-correction in the vicinity of the object plane. This can be realized by virtue of a doublet being used in the optical vicinity of the object plane, the doublet having a relative flint material in the diverging lens element and a relative crown material in the converging lens element. A possible practical implementation of this measure will be explained on the basis of FIG. 9, which shows a meridional lens element section through a projection lens 900 according to a fourth embodiment. The first lens element group LG1 consists of a total of six lens elements L1 to L6. The second lens element group LG2 consists of five lens elements L7 to L11. The third lens element group consists of four lens elements L12 to L15. The fourth lens element group LG4 consists of the lens elements L16 to L28. Four positive-negative doublets L14/L15, L16/L17, L18/L19 and L20/L21 with an achromatic effect are arranged in the stop region, the doublets being distributed in asymmetric fashion about the stop position since only one of these doublets is situated in the third lens element group LG3 and three of the doublets are situated in the fourth lens element group LG4.

In order to improve the aforementioned correction of the longitudinal chromatic aberration of the pupil imaging, a doublet made of a diverging lens element L2 made of relative flint material (LF5 of group C) and a converging lens element L3 made of relative crown material, specifically the material FK5 of group A, is situated within the first lens element group LG1 in the optical vicinity of the object plane OS.

In a manner similar to the third exemplary embodiment, a positive lens element L9 made of a relative flint material of group C, specifically LF5, is situated within the second lens element group LG2. Even though it would be possible to replace this lens element with a lens element made of a relative crown material (e.g., $SiO_2$), which is more expedient with respect to lens heating, this possible advantage is dispensed with here since this lens element may provide a large contribution to the chromatic correction of the Petzval sum by virtue of providing a relatively strong flint refractive power at a small marginal ray height.

Figures 10A, 10B, 10C, 10D:
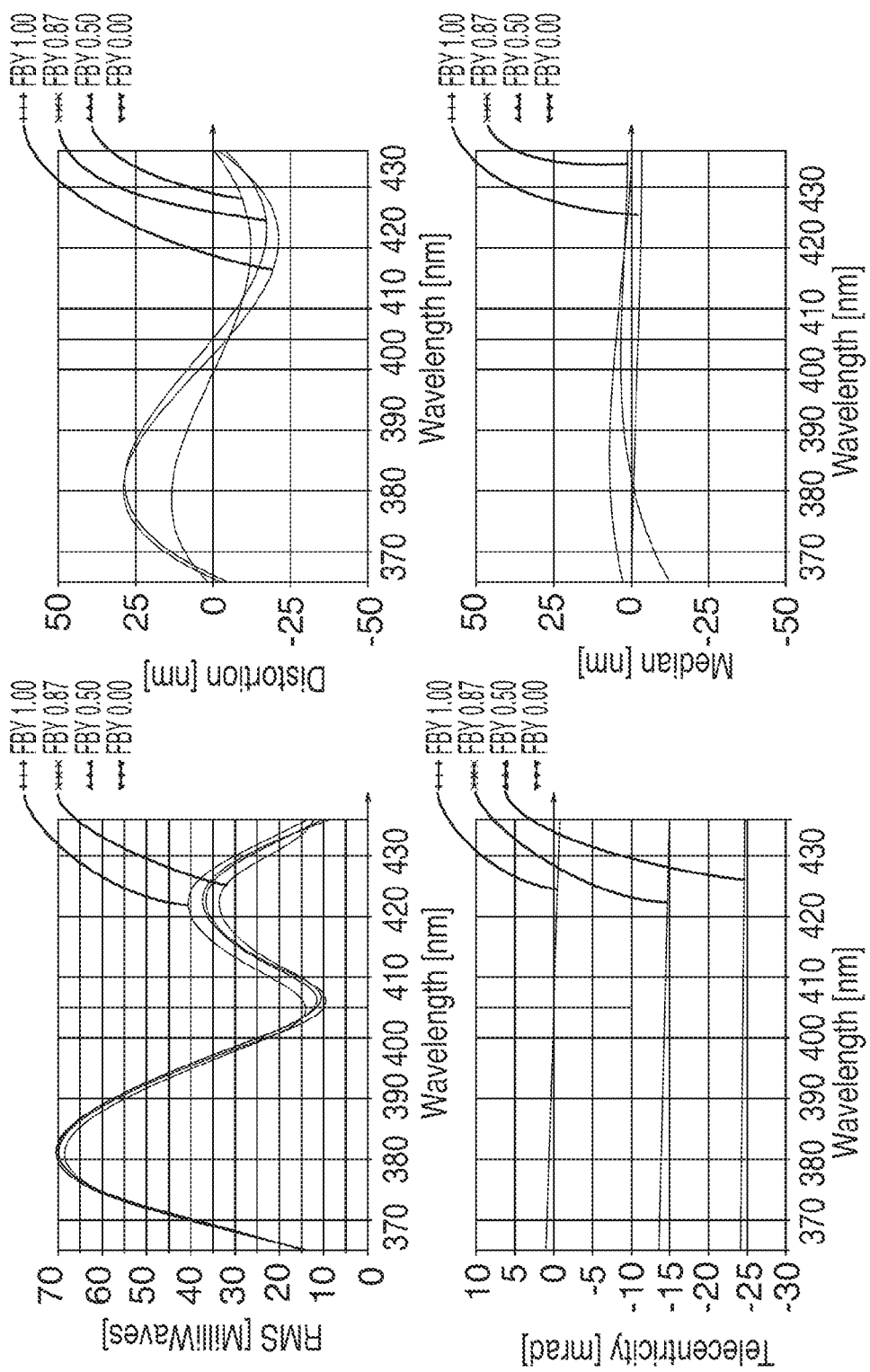
FIG. 10 shows, in FIG. 10A to FIG. 10D, diagrams for explaining the correction state or the imaging performance of the exemplary embodiment of FIG. 9.

In FIG. 10, the imaging performance of the fourth exemplary embodiment is illustrated on the basis of partial FIGS. 10A to 10D, in a manner analogous to FIGS. 3, 5 and 7. It is evident that significant improvements arise in relation to the other exemplary embodiments, particularly in the case of the chromatic variation of the telecentricity deviation (FIG. 10C).

It is evident from the exemplary embodiments that there are a number of measures that, individually or in combination with one another, may be advantageous in the illustrated lens type (reducing effect, refractive one-waist system) in view of the problem (chromatic correction for the simultaneous use of two or three emission lines of a mercury vapor lamp). Initially, massive use of crown material with anomalous partial dispersion in converging lens elements appears advantageous within the stop region. To this end, materials such as calcium fluoride ($CaF_2$) and N-FK51, S-FPL51 or S-FPL53 or optically similar materials of group B in FIG. 1 appear advantageous. Preferably, there should be at least five converging lens elements made of such a lens element material within the stop region.

The use of lens element materials of group A (as a relative flint material), such as, e.g., N-BK7 and/or N-FK5 and/or fused silica ($SiO_2$), in divergent lens elements within the stop region appears to be advantageous. Here, the use of $SiO_2$ or N-FK5 as flint material is possible; however, in respect of the chromatic correction, this offers fewer options than the material N-BK7 of the same group with a higher refractive index.

The use of a relative flint material of group C (e.g., LF5) in at least one object-near divergent lens element appears expedient, particularly in view of the chromatic variation of the entry pupil position.

In the case of lens elements with a relatively small free optical diameter, i.e., in the case of lens elements with relatively high radiation exposure per unit area, flint lens elements should be dispensed with where possible on account of the risk of lens heating or the risk of radiation-induced refractive index changes (compaction). Material that is resistant to lens heating, such as fused silica, for example, can be resorted to where possible, particularly in the direct vicinity of the image plane.

The wavefront correction can be greatly assisted without significantly increasing the number of lens elements by the use of aspherical lens elements. Where possible, aspherical surfaces should be applied to lens elements made of fused silica for technological reasons. All aspherical lens elements may be manufactured from fused silica within the scope of solutions according to the disclosure.

For a strong correction of the chromatic variation of the input telecentricity, it appears advantageous if at least one diverging lens element made of a relative flint material is combined with a converging lens element made of crown material within the fourth lens element group in the vicinity of the image plane.

Figure 11:
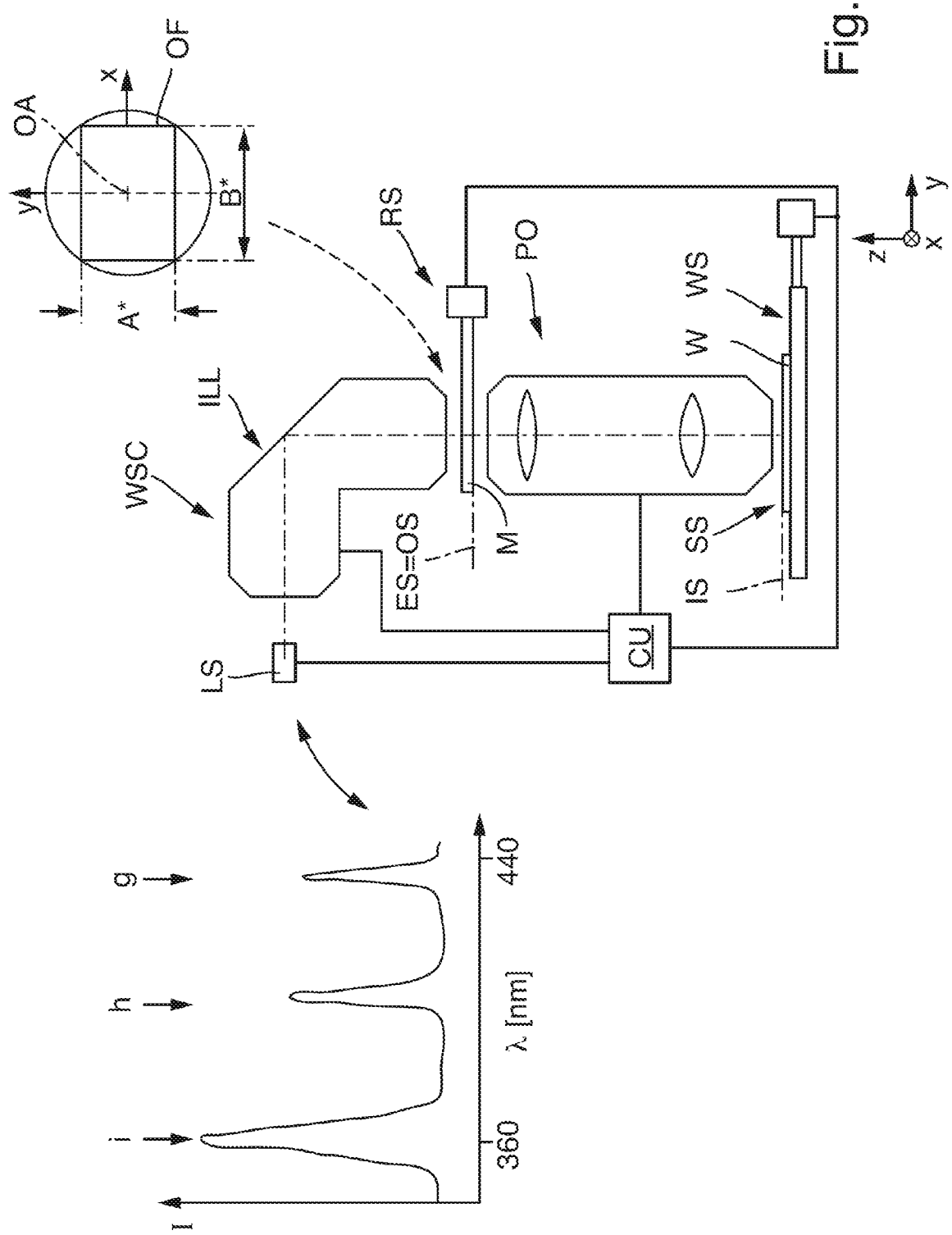
FIG. 11 shows a schematic illustration of a projection exposure apparatus in accordance with one exemplary embodiment.

FIG. 11 shows an example of a microlithographic projection exposure apparatus WST, which is employable in the production of semiconductor components and other finely structured components and which operates with light or electromagnetic radiation from the ultraviolet (UV) range and the visible (VIS) range in order to obtain resolutions down to fractions of micrometers. A mercury vapor lamp serves as primary radiation source or as light source LS. The lamp emits a broad spectrum with emission lines of relatively high intensity I in wavelength ranges with centroid wavelengths at approximately 436 nm (visible light, blue, g-line), approximately 405 nm (visible light, purple, h-line) and approximately 365.5 nm (near ultraviolet, UV-A, i-line). This part of the spectrum is illustrated in the schematic $I(\lambda)$ diagram.

At its exit surface ES, an illumination system ILL disposed downstream of the light source LS generates a large, sharply delimited and substantially homogeneously illuminated illumination field, which is adapted to the desire for telecentricity of the projection lens PO arranged downstream thereof in the light path. The illumination system ILL has devices for setting different illumination modes (illumination settings) and, for example, it can be switched between conventional on-axis illumination with different degrees of coherence σ and off-axis illumination.

Those optical components which receive the light from the light source LS and form illumination radiation from the light, which illumination radiation is directed to the reticle M, are part of the illumination system ILL of the projection exposure apparatus.

Arranged downstream of the illumination system is a device RS for holding and manipulating the mask M (reticle) in such a way that the pattern arranged at the reticle lies in the object plane OS of the projection lens PO, which coincides with the exit plane ES of the illumination system and which is also referred to here as reticle plane OS.

Following downstream of the reticle plane OS is the projection lens PO, which acts as a reduction lens and images an image of the pattern arranged at the mask M with a reduced imaging scale, for example with the scale of 1:4 (|β|=0.25) or 1:5 (|β|=0.20), onto a substrate W coated with a photoresist layer, the light-sensitive substrate surface SS of which lies in the region of the image plane IS of the projection lens PO.

The substrate to be exposed, which is a semiconductor wafer W in the exemplary case, is held by a device WS that is also referred to as "wafer stage".

The illumination field produced by the illumination system ILL defines the effective object field OF used during the projection exposure. In the exemplary case, the latter is rectangular, it has a height A* measured parallel to the y-direction and it has a width B*<A* measured perpendicular thereto (in the x-direction). The aspect ratio AR=B*/A* is approximately 26/33. The effective object field lies centered to the optical axis (on-axis field). The effective image field in the image surface IS, which is optically conjugate to the effective object field, has the same form and the same aspect ratio between the height B and width A as the effective object field, but the absolute field dimension is reduced by the imaging scale β of the projection lens, i.e. A=|β|A* and B=|β|B*. The field size of the image field is approximately 26×33 mm such that a complete "die" can be exposed in a single exposure step without scanning. The term "die" denotes a single unpackaged piece of a semiconductor wafer in semiconductor and microsystems technology. Accordingly, the projection exposure apparatus is designed as a wafer stepper for a step-and-repeat process. It is possible to dispense with devices for carrying out scanning operations for the exposure of a die.

The projection lens is designed according to an embodiment of the disclosure and has an image-side numerical aperture NA in the range of 0.3<NA<0.6, e.g., NA=0.5.

The part of the spectrum of the mercury vapor lamp including the g-line, h-line and i-line can be used for exposure purposes without spectral narrowing of the three employed emission lines. Therefore, corresponding narrowing devices, such as filters, for example, can be dispensed with.

The specifications of the projection lenses shown in the figures of the drawing are indicated in the tables compiled at the end of the description, the numbering of which tables respectively corresponds to the numbering of the corresponding figure of the drawing.

The tables summarize the specification of the respective design in tabular form. In this case, column "SURF" indicates the number of a refractive surface or surface distinguished in some other way, column "RADIUS" indicates the radius r of the surface (in mm), column "THICKNESS" indicates the distance d—designated as thickness—between the surface and the subsequent surface (in mm) and column "MATERIAL" indicates the material of the optical components. Columns "INDEX1", "INDEX2" and "INDEX3" indicate the refractive index of the material at the design operating wavelengths 405 nm (INDEX1), 365 nm (INDEX2) and 436 nm (INDEX3). Column "SEMIDIAM" indicates the usable, free radii or the free optical semidiameters of the lens elements (in mm) or of the optical elements. The radius r=0 (in the column "RADIUS") corresponds to a plane. Some optical surfaces are aspherical. Tables with appended "A" indicate the corresponding asphere data, wherein the aspherical surfaces are calculated according to the following specification:

$$p(h)=[((1/r)h^2)/(1+\text{SQRT}(1-(1+K)(1/r)^2h^2))]+C1*h^4+C2*h^6+\ldots$$

In this case, the reciprocal (1/r) of the radius indicates the surface curvature and h indicates the distance between a surface point and the optical axis (i.e. the beam height). Consequently, p(h) indicates the sagittal height, i.e. the distance between the surface point and the surface vertex in the z-direction (direction of the optical axis). The constants K, C1, C2, . . . are represented in the tables with appended "A".

All projection lenses in the exemplary embodiments are designed as dry lenses with an image-side numerical aperture of NA=0.5. In all exemplary embodiments, the object height is 84 mm in each case, corresponding to an image height of 21 mm in the case of an imaging scale of 4:1.

TABLE 2

(M557)

| SURF | RADIUS | THICKNESS | MATERIAL | INDEX1 (405 nm) | INDEX2 (365 nm) | INDEX3 (436 nm) | SEMIDIAM. |
|---|---|---|---|---|---|---|---|
| 0 | 0.000000 | 32.000000 | | | | | 84.0 |
| 1 | 0.000000 | 0.000000 | SILUV | 1.469595 | 1.474550 | 1.466705 | 88.4 |
| 2 | 0.000000 | 10.488214 | | | | | 88.4 |
| 3 | −3066.588980 | 22.492590 | LLF1 | 1.569035 | 1.579320 | 1.563301 | 89.6 |
| 4 | −301.851942 | 1.579616 | | | | | 90.6 |
| 5 | −373.563065 | 10.000000 | SILUV | 1.469595 | 1.474550 | 1.466705 | 90.5 |
| 6 | 194.039093 | 142.115106 | | | | | 92.9 |
| 7 | −1372.992013 | 37.210129 | LLF1 | 1.569035 | 1.579320 | 1.563301 | 124.6 |
| 8 | −255.045857 | 0.500000 | | | | | 126.5 |
| 9 | 288.543105 | 50.184066 | SILUV | 1.469595 | 1.474550 | 1.466705 | 126.6 |
| 10 | −657.477385 | 0.996820 | | | | | 125.2 |
| 11 | 135.554836 | 50.182456 | SILUV | 1.469595 | 1.474550 | 1.466705 | 104.2 |
| 12 | 682.222453 | 0.999227 | | | | | 98.9 |
| 13 | 301.157852 | 15.567401 | LLF1 | 1.569035 | 1.579320 | 1.563301 | 92.7 |
| 14 | 424.615272 | 8.907724 | | | | | 86.7 |
| 15 | 712.903444 | 10.000000 | SILUV | 1.469595 | 1.474550 | 1.466705 | 83.0 |
| 16 | 77.410124 | 35.517374 | | | | | 61.5 |
| 17 | −2404.634835 | 10.000000 | SILUV | 1.469595 | 1.474550 | 1.466705 | 60.1 |
| 18 | 150.108851 | 47.428114 | | | | | 55.7 |
| 19 | −77.101931 | 10.000000 | SILUV | 1.469595 | 1.474550 | 1.466705 | 53.2 |
| 20 | 150.030483 | 54.102293 | | | | | 61.8 |
| 21 | −620.724447 | 41.257957 | CAFUV | 1.441484 | 1.444913 | 1.439477 | 82.3 |
| 22 | −119.247987 | 30.680085 | | | | | 86.3 |
| 23 | 327.458398 | 52.459389 | CAFUV | 1.441484 | 1.444913 | 1.439477 | 102.3 |
| 24 | −210.116733 | 0.998527 | | | | | 102.5 |
| 25 | −290.186224 | 9.998661 | SILUV | 1.469595 | 1.474550 | 1.466705 | 100.8 |
| 26 | 217.560111 | 6.993915 | | | | | 101.1 |
| 27 | 249.928586 | 61.456926 | CAFUV | 1.441484 | 1.444913 | 1.439477 | 102.2 |
| 28 | −188.004673 | 1.960630 | | | | | 102.6 |
| 29 | −234.192516 | 10.000000 | LF5 | 1.606590 | 1.619262 | 1.599610 | 100.1 |
| 30 | −677.382127 | 0.998509 | | | | | 100.9 |
| 31 | 418.918086 | 45.351036 | CAFUV | 1.441484 | 1.444913 | 1.439477 | 100.2 |
| 32 | −218.207291 | 0.995405 | | | | | 99.2 |

TABLE 2-continued (M557)

| SURF | RADIUS | THICKNESS | MATERIAL | INDEX1 (405 nm) | INDEX2 (365 nm) | INDEX3 (436 nm) | SEMIDIAM. |
|---|---|---|---|---|---|---|---|
| 33 | −259.625842 | 10.000000 | N-BK7 | 1.530196 | 1.536270 | 1.526668 | 96.4 |
| 34 | 185.890992 | 17.419670 | | | | | 92.7 |
| 35 | 0.000000 | −16.163247 | | | | | 89.9 |
| 36 | 175.480435 | 59.683963 | CAFUV | 1.441484 | 1.444913 | 1.439477 | 94.4 |
| 37 | −208.385035 | 0.997407 | | | | | 94.8 |
| 38 | −233.843658 | 10.000000 | N-BK7 | 1.530196 | 1.536270 | 1.526668 | 94.1 |
| 39 | 317.971368 | 0.996606 | | | | | 95.9 |
| 40 | 170.659301 | 54.393032 | CAFUV | 1.441484 | 1.444913 | 1.439477 | 100.5 |
| 41 | −418.731762 | 14.011575 | | | | | 99.8 |
| 42 | −231.859939 | 10.000000 | SILUV | 1.469595 | 1.474550 | 1.466705 | 99.0 |
| 43 | 370.085048 | 0.996483 | | | | | 99.6 |
| 44 | 190.682107 | 49.052845 | CAFUV | 1.441484 | 1.444913 | 1.439477 | 103.0 |
| 45 | −584.264051 | 10.964524 | | | | | 102.6 |
| 46 | 209.648222 | 41.386413 | CAFUV | 1.441484 | 1.444913 | 1.439477 | 96.9 |
| 47 | −580.650786 | 0.998806 | | | | | 94.4 |
| 48 | 197.357516 | 26.186853 | LLF1 | 1.569035 | 1.579320 | 1.563301 | 82.0 |
| 49 | 1806.964362 | 14.549356 | | | | | 77.4 |
| 50 | −346.593645 | 10.000000 | SILUV | 1.469595 | 1.474550 | 1.466705 | 74.2 |
| 51 | 78.931585 | 1.991540 | | | | | 59.0 |
| 52 | 78.728491 | 34.825467 | LLF1 | 1.569035 | 1.579320 | 1.563301 | 58.9 |
| 53 | 607.396108 | 7.140922 | | | | | 54.9 |
| 54 | −2059.513172 | 59.658346 | SILUV | 1.469595 | 1.474550 | 1.466705 | 52.6 |
| 55 | −720.426837 | 1.998010 | | | | | 31.6 |
| 56 | 0.000000 | 5.000000 | SILUV | 1.469595 | 1.474550 | 1.466705 | 30.0 |
| 57 | 0.000000 | 12.000001 | | | | | 28.2 |
| 58 | 0.000000 | 0.000000 | | | | | 21.0 |

TABLE 2A

| | SRF | | | | |
|---|---|---|---|---|---|
| | 6 | 12 | 15 | 18 | 20 |
| K | 0 | 0 | 0 | 0 | 0 |
| C1 | −6.863416E−08 | 8.098932E−09 | −4.473097E−08 | −1.158699E−07 | −5.706916E−08 |
| C2 | 4.859334E−13 | −9.636806E−13 | 1.795891E−12 | −2.269592E−12 | −5.778211E−12 |
| C3 | −2.057195E−17 | 1.116154E−16 | 3.956550E−16 | 1.016917E−15 | −6.537264E−16 |
| C4 | 3.201639E−22 | −3.043770E−21 | −2.247059E−20 | −2.021504E−19 | 1.389772E−19 |
| C5 | −2.523114E−27 | 1.215573E−25 | 1.011706E−24 | 7.925535E−23 | −6.469700E−24 |

| | SRF | | |
|---|---|---|---|
| | 25 | 43 | 50 |
| K | 0 | 0 | 0 |
| C1 | −1.474550E−08 | 3.968249E−08 | −3.757050E−08 |
| C2 | −3.284497E−13 | 7.644498E−13 | 2.386569E−12 |
| C3 | −1.122133E−17 | −5.449285E−18 | −1.537060E−16 |
| C4 | −1.223126E−21 | −1.405063E−22 | 1.786545E−21 |
| C5 | 5.753652E−27 | −4.941869E−26 | −1.972665E−26 |

TABLE 4

(M559)

| SURF | RADIUS | THICKNESS | MATERIAL | INDEX1 (405 nm) | INDEX2 (365 nm) | INDEX3 (436 nm) | SEMIDIAM. |
|---|---|---|---|---|---|---|---|
| 0 | 0.000000 | 32.000000 | | | | | 84.0 |
| 1 | 0.000000 | 0.000000 | SILUV | 1.469595 | 1.474550 | 1.466705 | 88.3 |
| 2 | 0.000000 | 14.309414 | | | | | 88.3 |
| 3 | 1601.454014 | 26.901585 | LLF1 | 1.569035 | 1.579320 | 1.563301 | 90.6 |
| 4 | −294.456255 | 0.999673 | | | | | 91.2 |
| 5 | −365.921528 | 10.000000 | SILUV | 1.469595 | 1.474550 | 1.466705 | 90.9 |
| 6 | 155.952102 | 128.672266 | | | | | 92.0 |
| 7 | 1006.522321 | 54.587811 | SILUV | 1.469595 | 1.474550 | 1.466705 | 124.7 |
| 8 | −227.632906 | 1.489165 | | | | | 126.0 |
| 9 | 342.641138 | 34.468472 | LLF1 | 1.569035 | 1.579320 | 1.563301 | 120.5 |
| 10 | −2229.966423 | 0.999519 | | | | | 118.7 |
| 11 | 132.690286 | 51.967707 | SILUV | 1.469595 | 1.474550 | 1.466705 | 101.0 |

TABLE 4-continued (M559)

| SURF | RADIUS | THICKNESS | MATERIAL | INDEX1 (405 nm) | INDEX2 (365 nm) | INDEX3 (436 nm) | SEMIDIAM. |
|---|---|---|---|---|---|---|---|
| 12 | 2320.259303 | 17.147876 | | | | | 95.7 |
| 13 | 3041.492254 | 10.000000 | SILUV | 1.469595 | 1.474550 | 1.466705 | 82.3 |
| 14 | 77.021788 | 49.779199 | | | | | 61.2 |
| 15 | −233.338737 | 10.000000 | SILUV | 1.469595 | 1.474550 | 1.466705 | 57.6 |
| 16 | 149.949556 | 15.488125 | | | | | 55.1 |
| 17 | −685.688179 | 19.775505 | SILUV | 1.469595 | 1.474550 | 1.466705 | 55.1 |
| 18 | −133.540354 | 13.726182 | | | | | 55.4 |
| 19 | −79.419439 | 10.000000 | SILUV | 1.469595 | 1.474550 | 1.466705 | 54.7 |
| 20 | 165.215872 | 60.547438 | | | | | 62.7 |
| 21 | −170.325752 | 22.955284 | CAFUV | 1.441484 | 1.444913 | 1.439477 | 78.1 |
| 22 | −124.247984 | 11.269991 | | | | | 83.3 |
| 23 | −2190.071919 | 45.538744 | CAFUV | 1.441484 | 1.444913 | 1.439477 | 98.9 |
| 24 | −154.031663 | 0.999098 | | | | | 101.5 |
| 25 | 545.808992 | 43.725244 | CAFUV | 1.441484 | 1.444913 | 1.439477 | 103.2 |
| 26 | −229.406370 | 0.999024 | | | | | 102.9 |
| 27 | −251.658109 | 9.999296 | SILUV | 1.469595 | 1.474550 | 1.466705 | 101.6 |
| 28 | 183.764519 | 6.350105 | | | | | 98.9 |
| 29 | 201.746931 | 63.384469 | CAFUV | 1.441484 | 1.444913 | 1.439477 | 100.0 |
| 30 | −193.321898 | 1.960630 | | | | | 99.9 |
| 31 | −193.568772 | 10.000000 | LLF1 | 1.569035 | 1.579320 | 1.563301 | 99.0 |
| 32 | −689.652145 | 20.287795 | | | | | 100.1 |
| 33 | 0.000000 | −19.288279 | | | | | 99.2 |
| 34 | 493.214873 | 40.580058 | CAFUV | 1.441484 | 1.444913 | 1.439477 | 99.5 |
| 35 | −242.367111 | 0.998401 | | | | | 98.7 |
| 36 | −364.711933 | 10.000000 | N-BK7 | 1.530196 | 1.536270 | 1.526668 | 96.8 |
| 37 | 194.064049 | 3.392716 | | | | | 97.1 |
| 38 | 195.755445 | 61.886219 | CAFUV | 1.441484 | 1.444913 | 1.439477 | 98.6 |
| 39 | −202.134241 | 0.998153 | | | | | 98.9 |
| 40 | −258.368083 | 10.000000 | N-BK7 | 1.530196 | 1.536270 | 1.526668 | 97.4 |
| 41 | 377.361849 | 0.998542 | | | | | 98.0 |
| 42 | 169.391266 | 49.865594 | CAFUV | 1.441484 | 1.444913 | 1.439477 | 101.7 |
| 43 | −819.400373 | 17.475640 | | | | | 100.6 |
| 44 | −261.304523 | 10.000000 | SILUV | 1.469595 | 1.474550 | 1.466705 | 99.7 |
| 45 | 306.761975 | 0.998636 | | | | | 99.1 |
| 46 | 201.764198 | 39.011840 | CAFUV | 1.441484 | 1.444913 | 1.439477 | 100.9 |
| 47 | −2408.075279 | 0.999741 | | | | | 100.5 |
| 48 | 211.234247 | 41.343974 | CAFUV | 1.441484 | 1.444913 | 1.439477 | 98.6 |
| 49 | −667.553865 | 18.350777 | | | | | 96.5 |
| 50 | 200.734892 | 26.177613 | LLF1 | 1.569035 | 1.579320 | 1.563301 | 80.3 |
| 51 | 4959.675153 | 6.684911 | | | | | 76.3 |
| 52 | −184342.133874 | 10.000000 | SILUV | 1.469595 | 1.474550 | 1.466705 | 73.5 |
| 53 | 78.198234 | 1.994600 | | | | | 59.1 |
| 54 | 77.052486 | 33.979903 | LLF1 | 1.569035 | 1.579320 | 1.563301 | 58.9 |
| 55 | 354.190244 | 8.585860 | | | | | 54.4 |
| 56 | −3344.700847 | 56.363175 | SILUV | 1.469595 | 1.474550 | 1.466705 | 52.0 |
| 57 | 82675.596313 | 2.005252 | | | | | 31.1 |
| 58 | 0.000000 | 5.000000 | SILUV | 1.469595 | 1.474550 | 1.466705 | 29.9 |
| 59 | 0.000000 | 12.000001 | | | | | 28.1 |
| 60 | 0.000000 | 0.000000 | | | | | 21.0 |

TABLE 4A

| | SRF | | | | |
|---|---|---|---|---|---|
| | 6 | 12 | 13 | 16 | 20 |
| K | 0 | 0 | 0 | 0 | 0 |
| C1 | −7.786744E−08 | 2.126713E−08 | −3.208221E−10 | −1.528982E−07 | 4.209405E−08 |
| C2 | 1.848792E−13 | −1.667932E−13 | 4.003467E−12 | 9.061448E−12 | −1.932385E−11 |
| C3 | −3.672990E−17 | 5.503320E−17 | −1.493552E−16 | −4.642336E−16 | 3.430663E−16 |
| C4 | 4.518481E−22 | −2.256047E−21 | 1.132035E−20 | −1.183157E−19 | 1.243714E−19 |
| C5 | −5.082441E−26 | 1.553138E−25 | 3.321119E−25 | 5.546325E−23 | −8.442418E−24 |

| | SRF | | |
|---|---|---|---|
| | 27 | 45 | 52 |
| K | 0 | 0 | 0 |
| C1 | 3.188153E−09 | 3.306062E−08 | −7.214481E−08 |
| C2 | −6.863690E−14 | 3.378666E−13 | 1.127048E−13 |

TABLE 4A-continued

| | | | |
|---|---|---|---|
| C3 | −7.754061E−18 | −8.714749E−18 | 3.609713E−17 |
| C4 | −3.717181E−22 | −1.107411E−21 | −8.357575E−21 |
| C5 | −9.780808E−27 | 8.329776E−27 | 2.966092E−25 |

TABLE 6

| SURF | RADIUS | THICKNESS | MATERIAL | INDEX1 (405 nm) | INDEX2 (365 nm) | INDEX3 (436 nm) | SEMIDIAM. |
|---|---|---|---|---|---|---|---|
| 0 | 0.000000 | 32.000000 | | | | | 84.0 |
| 1 | 0.000000 | 0.000000 | SILUV | 1.469595 | 1.474550 | 1.466705 | 88.3 |
| 2 | 0.000000 | 13.722113 | | | | | 88.3 |
| 3 | −88089.103596 | 24.801749 | LLF1 | 1.569035 | 1.579320 | 1.563301 | 90.1 |
| 4 | −284.078028 | 5.879845 | | | | | 91.0 |
| 5 | −324.276413 | 10.000000 | SILUV | 1.469595 | 1.474550 | 1.466705 | 90.5 |
| 6 | 164.471863 | 119.930980 | | | | | 92.9 |
| 7 | 783.665848 | 49.595673 | SILUV | 1.469595 | 1.474550 | 1.466705 | 124.0 |
| 8 | −261.980527 | 0.500000 | | | | | 125.4 |
| 9 | 277.892422 | 46.144390 | SILUV | 1.469595 | 1.474550 | 1.466705 | 123.6 |
| 10 | −933.052133 | 0.999273 | | | | | 122.0 |
| 11 | 235.066300 | 26.913485 | LLF1 | 1.569035 | 1.579320 | 1.563301 | 109.8 |
| 12 | 567.178136 | 0.999873 | | | | | 105.9 |
| 13 | 161.748721 | 36.593609 | SILUV | 1.469595 | 1.474550 | 1.466705 | 94.2 |
| 14 | 1200.942967 | 8.148540 | | | | | 88.5 |
| 15 | −7125.311481 | 10.000000 | SILUV | 1.469595 | 1.474550 | 1.466705 | 84.0 |
| 16 | 76.630085 | 40.928588 | | | | | 61.3 |
| 17 | −280.223515 | 10.000000 | SILUV | 1.469595 | 1.474550 | 1.466705 | 60.2 |
| 18 | 149.972488 | 16.360169 | | | | | 57.3 |
| 19 | −552.378368 | 16.895913 | LLF1 | 1.569035 | 1.579320 | 1.563301 | 57.2 |
| 20 | −171.668434 | 25.426796 | | | | | 57.4 |
| 21 | −83.567201 | 10.000000 | SILUV | 1.469595 | 1.474550 | 1.466705 | 54.8 |
| 22 | 159.765616 | 63.525462 | | | | | 61.6 |
| 23 | −196.862683 | 21.612869 | CAFUV | 1.441484 | 1.444913 | 1.439477 | 78.5 |
| 24 | −137.243610 | 10.299271 | | | | | 83.1 |
| 25 | −4519.920765 | 42.539586 | CAFUV | 1.441484 | 1.444913 | 1.439477 | 96.3 |
| 26 | −160.492434 | 0.999669 | | | | | 98.7 |
| 27 | 796.546575 | 40.756607 | CAFUV | 1.441484 | 1.444913 | 1.439477 | 100.0 |
| 28 | −212.848898 | 0.998475 | | | | | 99.8 |
| 29 | −252.059497 | 9.999214 | SILUV | 1.469595 | 1.474550 | 1.466705 | 98.4 |
| 30 | 189.935323 | 6.421712 | | | | | 96.9 |
| 31 | 211.064944 | 62.340080 | CAFUV | 1.441484 | 1.444913 | 1.439477 | 98.0 |
| 32 | −179.593180 | 1.960630 | | | | | 98.0 |
| 33 | −184.365402 | 10.000000 | LLF1 | 1.569035 | 1.579320 | 1.563301 | 96.9 |
| 34 | −952.597178 | 18.614077 | | | | | 98.3 |
| 35 | 0.000000 | −17.614760 | | | | | 98.6 |
| 36 | 415.446251 | 42.947226 | CAFUV | 1.441484 | 1.444913 | 1.439477 | 98.5 |
| 37 | −232.009090 | 0.998803 | | | | | 97.9 |
| 38 | −370.771731 | 10.000000 | N-BK7 | 1.530196 | 1.536270 | 1.526668 | 96.5 |
| 39 | 188.062339 | 3.731176 | | | | | 97.2 |
| 40 | 192.483627 | 62.919554 | CAFUV | 1.441484 | 1.444913 | 1.439477 | 98.8 |
| 41 | −201.054753 | 0.998436 | | | | | 99.3 |
| 42 | −254.124823 | 10.000000 | N-BK7 | 1.530196 | 1.536270 | 1.526668 | 97.9 |
| 43 | 415.051249 | 0.999070 | | | | | 99.1 |
| 44 | 176.480015 | 49.892076 | CAFUV | 1.441484 | 1.444913 | 1.439477 | 103.1 |
| 45 | −757.866622 | 16.364910 | | | | | 102.1 |
| 46 | −274.634617 | 10.000000 | SILUV | 1.469595 | 1.474550 | 1.466705 | 101.3 |
| 47 | 365.501402 | 0.999335 | | | | | 100.9 |
| 48 | 225.431085 | 39.807869 | CAFUV | 1.441484 | 1.444913 | 1.439477 | 102.4 |
| 49 | −985.166839 | 1.106539 | | | | | 102.3 |
| 50 | 248.505089 | 42.056104 | CAFUV | 1.441484 | 1.444913 | 1.439477 | 100.5 |
| 51 | −452.942535 | 15.575839 | | | | | 98.7 |
| 52 | 204.336719 | 29.262404 | LLF1 | 1.569035 | 1.579320 | 1.563301 | 82.0 |
| 53 | −1459.732793 | 5.542878 | | | | | 78.1 |
| 54 | −1211.907300 | 10.000000 | SILUV | 1.469595 | 1.474550 | 1.466705 | 74.9 |
| 55 | 79.584147 | 1.996835 | | | | | 59.0 |
| 56 | 77.816247 | 30.059958 | LLF1 | 1.569035 | 1.579320 | 1.563301 | 58.7 |
| 57 | 226.807990 | 10.677199 | | | | | 54.2 |
| 58 | −10989.163903 | 57.444347 | SILUV | 1.469595 | 1.474550 | 1.466705 | 51.9 |
| 59 | −1890.769627 | 1.999291 | | | | | 31.3 |
| 60 | 0.000000 | 5.000000 | SILUV | 1.469595 | 1.474550 | 1.466705 | 29.9 |
| 61 | 0.000000 | 12.000000 | | | | | 28.1 |
| 62 | 0.000000 | 0.000000 | | | | | 21.0 |

TABLE 6A

| | SRF | | | | |
|---|---|---|---|---|---|
| | 6 | 7 | 15 | 18 | 22 |
| K | 0 | 0 | 0 | 0 | 0 |
| C1 | −9.182794E−08 | −6.568947E−09 | −7.898302E−09 | −1.878843E−07 | 3.835721E−08 |
| C2 | 6.884958E−13 | 1.277524E−13 | 1.286017E−12 | 2.507340E−12 | −1.911077E−11 |
| C3 | −5.077849E−17 | −4.325228E−18 | −9.282742E−17 | −3.644086E−16 | 1.076860E−16 |
| C4 | 9.302395E−22 | 2.450355E−23 | 9.513874E−21 | −3.481037E−20 | 1.486346E−19 |
| C5 | −4.390969E−26 | 0.000000E+00 | −3.470279E−25 | 1.845741E−23 | −9.208750E−24 |

| | SRF | | |
|---|---|---|---|
| | 29 | 47 | 54 |
| K | 0 | 0 | 0 |
| C1 | −3.932202E−09 | 4.088695E−08 | −4.510637E−08 |
| C2 | −3.235165E−13 | 3.957902E−13 | 4.931868E−13 |
| C3 | −1.490077E−17 | −4.413959E−18 | 2.908032E−17 |
| C4 | −6.784795E−22 | −6.329655E−22 | −3.767257E−21 |
| C5 | −1.190848E−26 | 5.966095E−27 | 5.908545E−26 |

TABLE 9

(M534)

| SURF | RADIUS | THICKNESS | MATERIAL | INDEX1 (405 nm) | INDEX2 (365 nm) | INDEX3 (436 nm) | SEMIDIAM. |
|---|---|---|---|---|---|---|---|
| 0 | 0.000000 | 32.000000 | | | | | 84.0 |
| 1 | 0.000000 | 0.000000 | SILUV | 1.469595 | 1.474550 | 1.466705 | 88.2 |
| 2 | 0.000000 | 31.531075 | | | | | 88.2 |
| 3 | 738.826552 | 9.999542 | SILUV | 1.469595 | 1.474550 | 1.466705 | 93.7 |
| 4 | 273.842606 | 43.528505 | | | | | 93.4 |
| 5 | −202.242883 | 10.000000 | LF5 | 1.606590 | 1.619262 | 1.599610 | 94.0 |
| 6 | 954.772842 | 3.130270 | | | | | 105.2 |
| 7 | 661.016163 | 49.275966 | N-FK5 | 1.498902 | 1.504009 | 1.495918 | 109.2 |
| 8 | −221.933141 | 0.997567 | | | | | 112.1 |
| 9 | 474.031651 | 45.460520 | SILUV | 1.469595 | 1.474550 | 1.466705 | 119.1 |
| 10 | −306.541179 | 0.998941 | | | | | 119.8 |
| 11 | 273.151891 | 41.045201 | N-FK5 | 1.498902 | 1.504009 | 1.495918 | 114.4 |
| 12 | −1012.396673 | 0.998509 | | | | | 112.3 |
| 13 | 198.609379 | 74.403117 | N-FK5 | 1.498902 | 1.504009 | 1.495918 | 98.3 |
| 14 | 123.668405 | 32.746432 | | | | | 66.7 |
| 15 | −231.492451 | 9.997845 | CAFUV | 1.441484 | 1.444913 | 1.439477 | 65.1 |
| 16 | 96.187671 | 28.201624 | | | | | 59.2 |
| 17 | −454.950333 | 10.000000 | SILUV | 1.469595 | 1.474550 | 1.466705 | 59.7 |
| 18 | 167.119158 | 3.633424 | | | | | 62.8 |
| 19 | 195.697982 | 29.656069 | LF5 | 1.606590 | 1.619262 | 1.599610 | 64.2 |
| 20 | −240.363488 | 66.300088 | | | | | 64.8 |
| 21 | −118.197952 | 10.000000 | SILUV | 1.469595 | 1.474550 | 1.466705 | 60.9 |
| 22 | 244.800727 | 33.098344 | | | | | 65.8 |
| 23 | −112.614434 | 10.000000 | SILUV | 1.469595 | 1.474550 | 1.466705 | 66.9 |
| 24 | 2005.609172 | 0.999136 | | | | | 81.8 |
| 25 | 580.553387 | 41.284616 | CAFUV | 1.441484 | 1.444913 | 1.439477 | 85.2 |
| 26 | −171.346115 | 0.998726 | | | | | 89.4 |
| 27 | 303.005450 | 48.757667 | CAFUV | 1.441484 | 1.444913 | 1.439477 | 105.4 |
| 28 | −291.552308 | 1.000000 | | | | | 106.4 |
| 29 | 292.015627 | 51.074053 | CAFUV | 1.441484 | 1.444913 | 1.439477 | 105.8 |
| 30 | −263.630029 | 11.251456 | | | | | 104.5 |
| 31 | 0.000000 | −10.210301 | | | | | 90.0 |
| 32 | −397.610410 | 10.000000 | SILUV | 1.469595 | 1.474550 | 1.466705 | 102.8 |
| 33 | 187.614126 | 6.338592 | | | | | 97.1 |
| 34 | 205.256118 | 60.237854 | CAFUV | 1.441484 | 1.444913 | 1.439477 | 97.7 |
| 35 | −195.586448 | 0.994698 | | | | | 97.5 |
| 36 | −218.132959 | 10.000000 | N-BK7 | 1.530196 | 1.536270 | 1.526668 | 96.7 |
| 37 | 217.261882 | 0.997367 | | | | | 100.1 |
| 38 | 202.704189 | 68.267975 | CAFUV | 1.441484 | 1.444913 | 1.439477 | 101.8 |
| 39 | −183.249952 | 0.995871 | | | | | 102.5 |
| 40 | −197.194868 | 10.000000 | N-BK7 | 1.530196 | 1.536270 | 1.526668 | 101.7 |
| 41 | 523.567957 | 0.995662 | | | | | 105.6 |
| 42 | 191.999505 | 69.896356 | CAFUV | 1.441484 | 1.444913 | 1.439477 | 111.9 |
| 43 | −266.324916 | 7.404262 | | | | | 111.2 |
| 44 | −231.208276 | 10.000000 | SILUV | 1.469595 | 1.474550 | 1.466705 | 109.9 |
| 45 | 1489.700472 | 0.997633 | | | | | 108.5 |
| 46 | 209.259994 | 50.993042 | CAFUV | 1.441484 | 1.444913 | 1.439477 | 110.7 |
| 47 | −635.886085 | 19.359200 | | | | | 109.5 |
| 48 | 131.761543 | 48.839873 | CAFUV | 1.441484 | 1.444913 | 1.439477 | 91.9 |

TABLE 9-continued (M534)

| SURF | RADIUS | THICKNESS | MATERIAL | INDEX1 (405 nm) | INDEX2 (365 nm) | INDEX3 (436 nm) | SEMIDIAM. |
|---|---|---|---|---|---|---|---|
| 49 | −2458.821770 | 8.408337 | | | | | 87.5 |
| 50 | −598.449726 | 20.001881 | LF5 | 1.606590 | 1.619262 | 1.599610 | 84.4 |
| 51 | 810.387978 | 20.174918 | | | | | 74.6 |
| 52 | 392.526819 | 10.000000 | SILUV | 1.469595 | 1.474550 | 1.466705 | 64.1 |
| 53 | 78.354300 | 2.147416 | | | | | 54.2 |
| 54 | 78.127753 | 36.225639 | LLF1 | 1.569035 | 1.579320 | 1.563301 | 54.0 |
| 55 | −270.398391 | 2.714763 | | | | | 50.1 |
| 56 | −216.462908 | 30.444902 | SILUV | 1.469595 | 1.474550 | 1.466705 | 48.0 |
| 57 | 311.561755 | 5.685139 | | | | | 32.4 |
| 58 | 0.000000 | 5.000000 | SILUV | 1.469595 | 1.474550 | 1.466705 | 30.0 |
| 59 | 0.000000 | 12.000001 | | | | | 28.2 |
| 60 | 0.000000 | 0.000000 | | | | | 21.0 |

TABLE 9A

| | SRF | | | | |
|---|---|---|---|---|---|
| | 3 | 9 | 18 | 22 | 24 |
| K | 0 | 0 | 0 | 0 | 0 |
| C1 | 7.292595E−08 | −2.141721E−08 | −1.049492E−07 | −5.765979E−08 | 1.784279E−08 |
| C2 | −1.473493E−12 | 2.692943E−13 | −8.703028E−13 | −7.652188E−12 | 3.143178E−12 |
| C3 | 4.108723E−17 | −8.365763E−18 | −4.473338E−16 | 1.837630E−16 | −8.459692E−17 |
| C4 | −1.441173E−21 | 1.430922E−22 | 4.950635E−20 | −1.291500E−19 | 1.203754E−20 |
| C5 | 4.164514E−26 | −3.600168E−27 | −1.204934E−23 | 1.225619E−23 | −1.296525E−24 |

| | SRF | | |
|---|---|---|---|
| | 32 | 45 | 52 |
| K | 0 | 0 | 0 |
| C1 | −4.497902E−08 | 3.320915E−08 | −7.566079E−08 |
| C2 | −1.736971E−13 | 6.082207E−13 | −4.656266E−13 |
| C3 | 5.334598E−18 | 6.008466E−19 | 3.360246E−16 |
| C4 | 1.280128E−22 | 2.080786E−23 | 1.977825E−20 |
| C5 | −1.898021E−26 | −2.197880E−26 | −1.153731E−24 |

What is claimed is:

1. A projection lens, comprising:
a multiplicity of lens elements arranged along an optical axis between object and image planes,
wherein:
the lens elements are configured to image a pattern in the object plane of the projection lens into the image plane of the projection lens with a reducing imaging scale;
the lens elements comprise first lens elements comprising a first material with a first Abbe number;
the lens elements comprise second lens elements comprising a second material with a second Abbe number;
the second Abbe number is greater than the first Abbe number;
the projection lens comprises exclusively the following lens element groups:
a first lens element group following the object plane, the first lens element group having positive refractive power;
a second lens element group following the first lens element group, the second lens element group having negative refractive power, the second lens element group configured to produce a waist around a region of minimal marginal ray heights between the object plane and the image plane;
a third lens element group following the second lens element group, the third lens element group being between the second lens element group and a stop position suitable for attaching an aperture stop, the third lens element group having positive refractive power; and
a fourth lens element group between the stop position and the image plane, the fourth lens element group having positive refractive power;
the first and second lens elements are configured to correct a wavefront aberration of the projection lens and a distortion of the projection lens at the same time for wavelength ranges of emission lines of a mercury vapor lamp at approximately 365 nm, approximately 405 nm and approximately 436 nm; and
the projection lens is a refractive projection lens.

2. The projection lens of claim 1, wherein at least one of the following holds:
the projection lens has an image-side numerical aperture of greater than 0.3 and less than 0.6;
the projection lens has an imaging scale is 1:4 or less; and
the projection lens is correctable for an effective image field with an image height of 21 mm or more.

3. The projection lens of claim 1, wherein:
the projection lens comprises a stop region around the stop position;
in the stop region, a ratio between a chief ray height and a marginal ray height is less than 0.3 applies;
in the stop region, the projection lens comprises a plurality of positive-negative doublets; and
for each positive-negative doublet, the positive-negative doublet comprises a positive lens element comprising the second material;

for each positive-negative doublet, the positive-negative doublet comprises a negative lens element comprising the first material.

4. The projection lens of claim 3, wherein the plurality of positive-negative doublets comprises from three positive-negative doublets to five positive-negative doublets.

5. The projection lens of claim 3, wherein, for at least one positive-negative doublet, the second material comprises calcium fluoride or another material with anomalous partial dispersion.

6. The projection lens of claim 3, wherein, for at least one positive-negative doublet, the first material consists of a material with anomalous partial dispersion.

7. The projection lens of claim 3, wherein, for at least one positive-negative doublet: the second material consists of calcium fluoride; and the first material consists of fused silica.

8. The projection lens of claim 3, wherein, within the stop region, a distribution of the positive-negative doublets is asymmetric relative to the stop position.

9. The projection lens of claim 3, wherein a number of positive-negative doublets within the fourth lens element group is greater than a number of positive-negative doublets within the third lens element group.

10. The projection lens of claim 1, wherein the fourth lens element group comprises a positive lens element in a vicinity of the image plane in a region with a low marginal ray height.

11. The projection lens of claim 10, wherein the positive lens element comprises a convexly curved entry surface and a concave exit surface.

12. The projection lens of claim 10, wherein a single lens element comprising fused silica is between the positive lens element and the image plane.

13. The projection lens of claim 10, wherein:
the positive lens element comprises an entry surface and an exit surface;
a free optical diameter of the positive lens element at its entry surface is greater than that of a lens element with a minimal free optical diameter within the projection lens; and
a free optical diameter of the positive lens element at its exit surface is greater than that of a lens element with a minimal free optical diameter within the projection lens.

14. The projection lens of claim 1, wherein a multiplicity of the lens elements comprises aspherical lens elements with at least one rotationally symmetric aspherical optical surface.

15. The projection lens of claim 14, wherein at least 80% of the aspherical lens elements consist of fused silica.

16. The projection lens of claim 1, wherein a positive lens element is in the second lens element group between an object-side negative lens element and an image-side negative lens element.

17. The projection lens of claim 16, wherein the positive lens element consists of fused silica.

18. The projection lens of claim 1, wherein the first lens element group comprises a positive-negative doublet with a positive lens element comprising the second material and a negative lens element comprising the first material.

19. The projection lens of claim 18, wherein the positive-negative doublet is between the object plane and a region of maximum marginal ray height within the first lens element group.

20. The projection lens of claim 18, wherein the positive-negative doublet immediately follows the object plane.

21. An apparatus, comprising:
a mercury vapor lamp configured to emit radiation with emission lines at approximately 365 nm, approximately 405 nm and approximately 436 nm;
an illumination system configured to receive the light of the mercury vapor lamp and to form illumination radiation; and
a projection lens according to claim 1,
wherein the apparatus is a projection exposure apparatus.

22. The apparatus of claim 21, wherein the mercury vapor lamp has no filter for spectral narrowing of the bandwidth of one of the emission lines assigned thereto.

23. The apparatus of claim 21, wherein the projection exposure apparatus is a wafer-stepper apparatus configured to operate via a step-and-repeat process.

24. A method of using a projection exposure apparatus comprising an illumination system and a projection lens, the method comprising:
using the illumination system to illuminate at least a portion of a pattern in an object plane of the projection lens; and
using the lens to project an image of the illuminated portion of the pattern onto a radiation-sensitive material in an image plane of the projection lens,
wherein the projection lens is a projection lens according to claim 1.

25. The projection exposure method as claimed in claim 24, wherein:
the radiation-sensitive material is supported by a substrate; and
the method uses the projection exposure apparatus to expose individual dies of the substrate to two or three of the emission lines of the mercury vapor lamp, lying at approximately 365 nm, approximately 405 nm and approximately 436 nm without scanning in a step-and-repeat process.

26. The projection lens of claim 1, wherein the first and second lens elements are configured to correct the distortion of the projection lens to less than 5 nm at the same time for wavelength ranges of emission lines of the mercury vapor lamp at approximately 365 nm, approximately 405 nm and approximately 436 nm.

27. The projection lens of claim 26, wherein the first and second lens elements are configured so that a polychromatic RMS value of the wavefront aberration of the projection lens is no more than 20 m$\lambda$ at the same time for wavelength ranges of emission lines of the mercury vapor lamp at approximately 365 nm, approximately 405 nm and approximately 436 nm.

28. The projection lens of claim 1, wherein the first and second lens elements are configured so that a polychromatic RMS value of the wavefront aberration of the projection lens is no more than 20 m$\lambda$ at the same time for wavelength ranges of emission lines of the mercury vapor lamp at approximately 365 nm, approximately 405 nm and approximately 436 nm.

29. The projection lens of claim 1, wherein the first and second lens elements are configured so that a polychromatic RMS value of the wavefront aberration of the projection lens is no more than 18 m$\lambda$ at the same time for wavelength ranges of emission lines of the mercury vapor lamp at approximately 365 nm, approximately 405 nm and approximately 436 nm.

30. The projection lens of claim 1, wherein the first and second lens elements are configured so that a polychromatic RMS value of the wavefront aberration of the projection lens is no more than 15 m$\lambda$ at the same time for wavelength ranges of emission lines of the mercury vapor lamp at approximately 365 nm, approximately 405 nm and approximately 436 nm.

\* \* \* \* \*

UNITED STATES PATENT AND TRADEMARK OFFICE
CERTIFICATE OF CORRECTION

PATENT NO. : 10,969,694 B2
APPLICATION NO. : 16/587943
DATED : April 6, 2021
INVENTOR(S) : Alexander Epple and David Shafer Page 1 of 1

It is certified that error appears in the above-identified patent and that said Letters Patent is hereby corrected as shown below:

In the Specification

Column 1, Lines 42-55, delete "Currently, critical structures, i.e., fine structures, are predominantly produced using modern immersion systems that operate with operating wavelengths in the deep ultraviolet range (DUV), in particular at approximately 193 nm. Image-side numerical apertures NA> 1 can be achieved using immersion systems. In future, critical structures will also be exposed using EUV systems. This is understood to mean projection exposure apparatuses constructed using reflective components only, which operate with moderate numerical apertures at operating wavelengths in the extreme ultraviolet range (EUV) between approximately 5 nm and 20 nm, e.g., at approximately 13.4 mm. These systems are distinguished, inter alia, by high acquisition costs." and insert the same on Column 1, Line 43, as a new paragraph.

Column 3, Line 1, delete "imagable" and insert -- imageable --.

Signed and Sealed this
Eighth Day of June, 2021

Drew Hirshfeld
*Performing the Functions and Duties of the*
*Under Secretary of Commerce for Intellectual Property and*
*Director of the United States Patent and Trademark Office*